(12) United States Patent
Yamagishi et al.

(10) Patent No.: US 12,087,798 B2
(45) Date of Patent: Sep. 10, 2024

(54) IMAGING ELEMENT AND IMAGING DEVICE

(71) Applicant: SONY SEMICONDUCTOR SOLUTIONS CORPORATION, Kanagawa (JP)

(72) Inventors: Katsumi Yamagishi, Kanagawa (JP); Shinya Itoh, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 311 days.

(21) Appl. No.: 17/641,749

(22) PCT Filed: Jul. 9, 2020

(86) PCT No.: PCT/JP2020/026890
§ 371 (c)(1),
(2) Date: Mar. 9, 2022

(87) PCT Pub. No.: WO2021/053940
PCT Pub. Date: Mar. 25, 2021

(65) Prior Publication Data
US 2022/0302197 A1    Sep. 22, 2022

(30) Foreign Application Priority Data
Sep. 17, 2019   (JP) .................................. 2019-168130

(51) Int. Cl.
*H01L 27/146* (2006.01)

(52) U.S. Cl.
CPC .. *H01L 27/14641* (2013.01); *H01L 27/14638* (2013.01)

(58) Field of Classification Search
CPC ......... H01L 27/14603; H01L 27/14605; H01L 27/14607; H01L 27/1461; H01L 27/14638; H01L 27/14641
See application file for complete search history.

(56) References Cited

U.S. PATENT DOCUMENTS

| | | | |
|---|---|---|---|
| 2014/0146197 A1 | 5/2014 | Okuzawa et al. | |
| 2018/0350856 A1 | 12/2018 | Masagaki et al. | |
| 2023/0282672 A1* | 9/2023 | Tsuboi | H01L 27/14641 257/292 |

FOREIGN PATENT DOCUMENTS

| | | |
|---|---|---|
| CN | 103856700 A | 6/2014 |
| CN | 107408568 A | 11/2017 |

(Continued)

OTHER PUBLICATIONS

International Search Report and Written Opinion of PCT Application No. PCT/JP2020/026890, issued on Oct. 6, 2020, 08 pages of ISRWO.

*Primary Examiner* — Kevin K Pyo
(74) *Attorney, Agent, or Firm* — CHIP LAW GROUP

(57) ABSTRACT

An imaging device includes a plurality of imaging elements 10. Each of the imaging elements 10 includes: a plurality of photoelectric conversion regions PD arrayed in a first direction and a second direction; a floating diffusion layer FD shared by the photoelectric conversion regions PD; a transfer control electrode TG; a first charge transfer control electrode CG that controls charge transfer between the photoelectric conversion regions PD arrayed in the first direction; and a second charge transfer control electrode CG that controls charge transfer between the photoelectric conversion regions PD arrayed in the second direction.

12 Claims, 23 Drawing Sheets

(56) References Cited

FOREIGN PATENT DOCUMENTS

| | | | |
|---|---|---|---|
| EP | 3410487 | A1 | 12/2018 |
| JP | 2014-107835 | A | 6/2014 |
| JP | 2019-041018 | A | 3/2019 |
| KR | 10-2018-0108414 | A | 10/2018 |
| WO | 2017/130723 | A1 | 8/2017 |
| WO | 2019/039029 | A1 | 2/2019 |

* cited by examiner

[QUADRUPLE DENSITY DRIVING]

FIG. 13A

| PD$_{1,1}$ | PD$_{1,2}$ | PD$_{1,3}$ | PD$_{1,4}$ | PD$_{1,5}$ | PD$_{1,6}$ | PD$_{1,7}$ | PD$_{1,8}$ |
|---|---|---|---|---|---|---|---|
| PD$_{2,1}$ | PD$_{2,2}$ | PD$_{2,3}$ | PD$_{2,4}$ | PD$_{2,5}$ | PD$_{2,6}$ | PD$_{2,7}$ | PD$_{2,8}$ |
| PD$_{3,1}$ | PD$_{3,2}$ | PD$_{3,3}$ | PD$_{3,4}$ | PD$_{3,5}$ | PD$_{3,6}$ | PD$_{3,7}$ | PD$_{3,8}$ |
| PD$_{4,1}$ | PD$_{4,2}$ | PD$_{4,3}$ | PD$_{4,4}$ | PD$_{4,5}$ | PD$_{4,6}$ | PD$_{4,7}$ | PD$_{4,8}$ |
| PD$_{5,1}$ | PD$_{5,2}$ | PD$_{5,3}$ | PD$_{5,4}$ | PD$_{5,5}$ | PD$_{5,6}$ | PD$_{5,7}$ | PD$_{5,8}$ |
| PD$_{6,1}$ | PD$_{6,2}$ | PD$_{6,3}$ | PD$_{6,4}$ | PD$_{6,5}$ | PD$_{6,6}$ | PD$_{6,7}$ | PD$_{6,8}$ |
| PD$_{7,1}$ | PD$_{7,2}$ | PD$_{7,3}$ | PD$_{7,4}$ | PD$_{7,5}$ | PD$_{7,6}$ | PD$_{7,7}$ | PD$_{7,8}$ |
| PD$_{8,1}$ | PD$_{8,2}$ | PD$_{8,3}$ | PD$_{8,4}$ | PD$_{8,5}$ | PD$_{8,6}$ | PD$_{8,7}$ | PD$_{8,8}$ |

FIG. 13B

| E | D | D | C | C | B | B | A |
|---|---|---|---|---|---|---|---|
| E | E | D | D | C | C | B | B |
| F | E | E | D | D | C | C | B |
| F | F | E | E | D | D | C | C |
| G | F | F | E | E | D | D | C |
| G | G | F | F | E | E | D | D |
| H | G | G | F | F | E | E | D |
| H | H | G | G | F | F | E | E |

IMAGING ELEMENT AND IMAGING DEVICE

CROSS REFERENCE TO RELATED APPLICATIONS

This application is a U.S. National Phase of International Patent Application No. PCT/JP2020/026890 filed on Jul. 9, 2020, which claims priority benefit of Japanese Patent Application No. JP 2019-168130 filed in the Japan Patent Office on Sep. 17, 2019. Each of the above-referenced applications is hereby incorporated herein by reference in its entirety.

TECHNICAL FIELD

The present disclosure relates to an imaging element and an imaging device including a plurality of the imaging elements.

BACKGROUND ART

In an imaging device including a plurality of imaging elements arrayed in a two-dimensional matrix and one lens that condenses light to these imaging elements, a technique is known in which a photoelectric conversion region included in one imaging element is divided into 2×2 photoelectric conversion regions, and focus detection is performed on the basis of a phase difference of an image signal obtained from the divided photoelectric conversion regions (see, for example, Japanese Patent Application Laid-Open No. 2014-107835). An imaging element according to claim 7 of Japanese Patent Application Laid-Open No. 2014-107835 includes:
a first pixel and a second pixel sharing a first microlens;
a third pixel and a fourth pixel sharing a second micro lens;
a first boundary portion formed between the first pixel and the second pixel; and
a second boundary portion formed between the third pixel and the fourth pixel.
In a case where the amount of charges of the first pixel and the third pixel are saturated, a first amount of charges transferred from the first pixel to the second pixel via the first boundary portion is larger than a second amount of charges transferred from the third pixel to the fourth pixel via the second boundary portion.

CITATION LIST

Patent Document

Patent Document 1: Japanese Patent Application Laid-Open No. 2014-107835

SUMMARY OF THE INVENTION

Problems to be Solved by the Invention

By the way, in the imaging device disclosed in Japanese Patent Application Laid-Open No. 2014-107835, in a certain imaging element, focus detection in a vertical direction is performed by addition of images from two pixels located on an upper side and addition of images from two pixels located on a lower side among four divided pixels. Furthermore, in another imaging element, focus detection in a horizontal direction is performed by addition of images from two pixels located on a right side and addition of images from two pixels located on a left side among four divided pixels. Therefore, each of the number of imaging elements that are subjected to focus detection in the vertical direction and the number of imaging elements that are subjected to focus detection in the horizontal direction is only half of the total number of imaging elements that are subjected to focus detection. Furthermore, charge transfer control between pixels is performed on the basis of an impurity concentration of a boundary portion located between the pixels, and the degree of freedom of the charge transfer control between the pixels is low.

Therefore, an object of the present disclosure is to provide an imaging device capable of performing more accurate focus detection also depending on the position of the imaging device (the position in a lateral direction and the position in a longitudinal direction), and an imaging element suitable for being incorporated in the imaging device.

Solutions to Problems

An imaging device of the present disclosure for achieving the object described above includes a plurality of imaging elements, and
each of the imaging elements is constituted by the following imaging element of the present disclosure.
The imaging element of the present disclosure for achieving the object described above includes:
M×N photoelectric conversion regions arrayed such that M photoelectric conversion regions are arrayed in a first direction and N photoelectric conversion regions are arrayed in a second direction different from the first direction;
a floating diffusion layer shared by the M×N photoelectric conversion regions;
a transfer control electrode that is disposed corresponding to each of the photoelectric conversion regions and transfers charges generated in each of the photoelectric conversion regions to the floating diffusion layer;
(M−1)×N first charge transfer control electrodes that control charge transfer between the M photoelectric conversion regions arrayed in the first direction; and
(N−1)×M second charge transfer control electrodes that control charge transfer between the N photoelectric conversion regions arrayed in the second direction.
In the M photoelectric conversion regions arrayed in the first direction, an m-th first charge transfer control electrode [in which m is any integer of 1 to (M−1)] controls charge transfer between an m-th photoelectric conversion region and an (m+1)-th photoelectric conversion region, and
in the N photoelectric conversion regions arrayed in the second direction, an n-th second charge transfer control electrode [in which n is any integer of 1 to (N−1)] controls charge transfer between an n-th photoelectric conversion region and an (n+1)-th photoelectric conversion region.

BRIEF DESCRIPTION OF DRAWINGS

FIGS. 13A and 13B are a diagram schematically illustrating arrangement of M×N=8×8 photoelectric conversion regions and a diagram schematically illustrating an example of an obtained image signal, respectively, in a modification of the imaging device of Example 1.

MODE FOR CARRYING OUT THE INVENTION

Figure 1A:
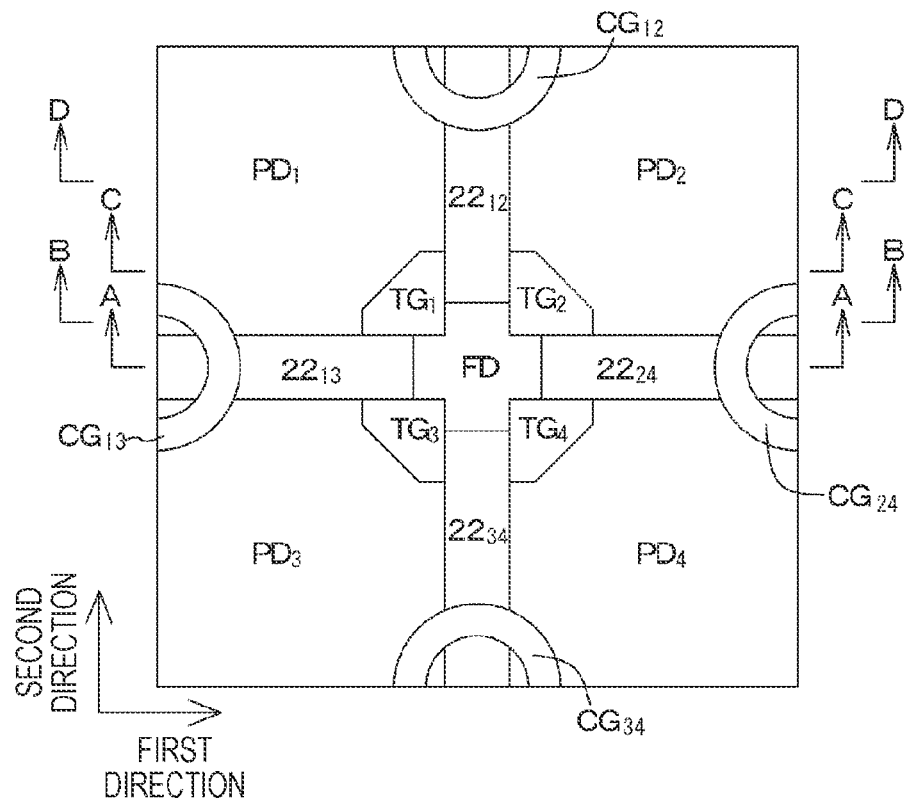
FIGS. 1A and 1B are a diagram schematically illustrating arrangement of a photoelectric conversion region, a floating diffusion layer, a transfer control electrode, a charge transfer control electrode, and a boundary region, and a diagram schematically illustrating arrangement of the photoelectric conversion region, the floating diffusion layer, and the boundary region, respectively, in an imaging element of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description on imaging device of the present disclosure and imaging element of the present disclosure
2. Example 1 (imaging device of the present disclosure and imaging element of the present disclosure)
3. Example 2 (modification of Example 1)
4. Example 3 (modifications of Examples 1 and 2)
5. Others <General Description on Imaging Device of the Present Disclosure and Imaging Element of the Present Disclosure>

In an imaging device of the present disclosure, M=2 and N=2, and each imaging element can include:
- a first photoelectric conversion region and a second photoelectric conversion region juxtaposed in a first direction, a third photoelectric conversion region disposed adjacent to the first photoelectric conversion region in a second direction, and a fourth photoelectric conversion region disposed adjacent to the second photoelectric conversion region and the third photoelectric conversion region;
- a floating diffusion layer shared by the first photoelectric conversion region, the second photoelectric conversion region, the third photoelectric conversion region, and the fourth photoelectric conversion region;
- a first transfer control electrode that transfers charges generated in the first photoelectric conversion region to the floating diffusion layer;

a second transfer control electrode that transfers charges generated in the second photoelectric conversion region to the floating diffusion layer;

a third transfer control electrode that transfers charges generated in the third photoelectric conversion region to the floating diffusion layer;

a fourth transfer control electrode that transfers charges generated in the fourth photoelectric conversion region to the floating diffusion layer;

a first-A charge transfer control electrode that controls charge transfer between the first photoelectric conversion region and the second photoelectric conversion region;

a first-B charge transfer control electrode that controls charge transfer between the third photoelectric conversion region and the fourth photoelectric conversion region;

a second-A charge transfer control electrode that controls charge transfer between the first photoelectric conversion region and the third photoelectric conversion region; and a second-B charge transfer control electrode that controls charge transfer between the second photoelectric conversion region and the fourth photoelectric conversion region.

The imaging device of the present disclosure including the preferable form described above can have a configuration in which the imaging device further includes a control circuit, and at the time of imaging, the control circuit controls operations of the first charge transfer control electrode and the second charge transfer control electrode in a first mode in which the first charge transfer control electrode is turned into an inoperative state when the second charge transfer control electrode is in an operative state, and in a second mode in which the second charge transfer control electrode is turned into an inoperative state when the first charge transfer control electrode is in an operative state, and in this case, at the time of imaging, the control circuit further controls the operations of the first charge transfer control electrode and the second charge transfer control electrode in a third mode in which the first charge transfer control electrode and the second charge transfer control electrode are turned into an inoperative state. In addition, in these configurations, the control circuit can switch between the first mode and the second mode on the basis of posture information of the imaging device. Moreover, in this case, the posture information of the imaging device can be information indicating that the imaging device is located in a lateral direction and information indicating that the imaging device is located in a longitudinal direction. Note that switching between the first mode and the second mode, that is, whether the imaging device is located in a lateral direction or in a longitudinal direction can be detected by, for example, a known posture sensor incorporated in the imaging device. Alternatively, by operating a switch or the like disposed in the imaging device, an operator of the imaging device can switch between the first mode and the second mode, or can switch a mode from the first mode or the second mode to the third mode, or can switch a mode from the third mode to the first mode or the second mode.

The first direction is preferably orthogonal to the second direction. Note that, in a case where the imaging device is located in a lateral direction, the operation is performed in the first mode, and in a case where the imaging device is located in a longitudinal direction, the operation is performed in the second mode.

In the imaging device of the present disclosure or the imaging element of the present disclosure including the various preferable forms and configurations described above, a maximum value of an impurity concentration in a boundary region located between the photoelectric conversion region and the photoelectric conversion region can be lower than a maximum value of an impurity concentration in the photoelectric conversion region. Alternatively, a depth at which the impurity concentration in the boundary region located between the photoelectric conversion region and the photoelectric conversion region indicates the maximum value can be shallower than a depth at which the impurity concentration in the photoelectric conversion region indicates the maximum value. Alternatively, these two forms can be combined.

Moreover, in the imaging device or the imaging element of the present disclosure including the various preferable forms and configurations described above, the width of the boundary region located between the photoelectric conversion region and the photoelectric conversion region can be narrower than the width of the photoelectric conversion region.

Moreover, in the imaging device of the present disclosure including the various preferable forms and configurations described above, an operating voltage of the (M−1)×N first charge transfer control electrodes can be the same as an operating voltage of the (N−1)×M second charge transfer control electrodes, or the operating voltage of the (M−1)×N first charge transfer control electrodes can be different from the operating voltage of the (N−1)×M second charge transfer control electrodes.

In the imaging device or the imaging element of the present disclosure including the preferable forms and configurations described above, a CMOS image sensor can be exemplified as the imaging element. Furthermore, in the imaging device or the imaging element of the present disclosure including the preferable forms and configurations described above, the imaging device and the imaging element can be a front irradiation type imaging device and imaging element, or can be a back irradiation type imaging device and imaging element. For example, a digital still camera, a video camera, a camcorder, a surveillance camera, a vehicle-mounted camera, a smartphone camera, a game user interface camera, or a biometric authentication camera can be constituted by the imaging device. Furthermore, a single-plate color solid-state imaging device can be constituted by the imaging device.

In the imaging device of the present disclosure or the imaging element of the present disclosure including the preferable forms and configurations described above, the imaging element can include an on-chip microlens (OCL).

Furthermore, the imaging device of the present disclosure including the preferable forms and configurations described above can include one condenser that condenses incident light on a plurality of imaging elements.

The photoelectric conversion region, the floating diffusion layer, and the boundary region (hereinafter, these may be collectively referred to as a "photoelectric conversion region or the like" for convenience) may be formed in a semiconductor layer or may be formed in a semiconductor substrate. Note that the semiconductor layer and the semiconductor substrate in which the photoelectric conversion region, the floating diffusion layer, and the boundary region are formed may be collectively referred to as a "base" for convenience.

Examples of the semiconductor layer include a silicon semiconductor layer, and in order to obtain the semiconductor layer, for example, it is only required to use a silicon on insulator (SOI) substrate. Furthermore, examples of the semiconductor substrate include a silicon semiconductor substrate.

Configurations and structures of the photoelectric conversion region and the floating diffusion layer can be known configurations and structures. The transfer control electrode is connected to a drive circuit, and by applying an appropriate voltage from the drive circuit to the transfer control electrode, charges generated in the photoelectric conversion region can be transferred to the floating diffusion layer. Such a transfer control electrode is disposed so as to face a region of the base located between the photoelectric conversion region and the floating diffusion layer with an insulating film interposed therebetween. The charge transfer control electrode is connected to a control circuit, and by applying an appropriate voltage from the control circuit to the charge transfer control electrode, charge transfer between adjacent photoelectric conversion regions can be controlled. Such a charge transfer control electrode is disposed so as to face a region (a part of the boundary region) of the base located between adjacent photoelectric conversion regions with an insulating film interposed therebetween. The planar shapes of the transfer control electrode and the charge transfer control electrode are essentially arbitrary, and it is only required to appropriately determine the planar shapes according to specifications required for the imaging element.

It is only required to constitute the transfer control electrode and the charge transfer control electrode by a known conductive material (a transparent conductive material or an opaque conductive material). Examples of the transparent conductive material include a conductive metal oxide. Specific examples thereof include indium oxide, indium-tin oxide (ITO, including Sn-doped $In_2O_3$, crystalline ITO, and amorphous ITO), indium-zinc oxide (IZO) obtained by adding indium as a dopant to zinc oxide, indium-gallium oxide (IGO) obtained by adding indium as a dopant to gallium oxide, indium-gallium-zinc oxide (IGZO, In—$GaZnO_4$) obtained by adding indium and gallium as a dopant to zinc oxide, indium-tin-zinc oxide (ITZO) obtained by adding indium and tin as a dopant to zinc oxide, IFO (F-doped $In_2O_3$), tin oxide ($SnO_2$), ATO (Sb-doped $SnO_2$), FTO (F-doped $SnO_2$), zinc oxide (including ZnO doped with another element), aluminum-zinc oxide (AZO) obtained by adding aluminum as a dopant to zinc oxide, gallium-zinc oxide (GZO) obtained by adding gallium as a dopant to zinc oxide, titanium oxide ($TiO_2$), niobium-titanium oxide (TNO) obtained by adding niobium as a dopant to titanium oxide, antimony oxide, CuI, $InSbO_4$, ZnMgO, $CuInO_2$, $MgIn_2O_4$, CdO, $ZnSnO_3$, a spinel type oxide, and an oxide having a $YbFe_2O_4$ structure. Alternatively, examples of the transparent electrode include a transparent electrode containing gallium oxide, titanium oxide, niobium oxide, nickel oxide, and the like as a base layer.

Furthermore, examples of the opaque conductive material include a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), an alloy containing these metal elements, a conductive particle containing these metals, a conductive particle of an alloy containing these metals, a polysilicon containing impurities, a carbon material, an oxide semiconductor material, and a conductive material such as a carbon nanotube or graphene. A laminated structure of layers containing these elements can be also used. Moreover, examples of the opaque conductive material include an organic material (conductive polymer) such as poly(3,4-ethylenedioxythiophene)/polystyrene sulfonic acid [PEDOT/PSS]. Furthermore, these conductive materials may be mixed with a binder (polymer) to form a paste or an ink, and the paste or the ink may be cured to be used as an electrode.

As a method for forming the transfer control electrode and the charge transfer control electrode, a dry method or a wet method can be used. Examples of the dry method include a physical vapor deposition method (PVD method) and a chemical vapor deposition method (CVD method). Examples of a film formation using the principle of the PVD method include a vacuum vapor deposition method using resistance heating or high frequency heating, an electron beam (EB) vapor deposition method, various sputtering methods (magnetron sputtering method, RF-DC coupled bias sputtering method, ECR sputtering method, opposing target sputtering method, or high frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and an optical CVD method. Meanwhile, examples of the wet method include an electrolytic plating method, an electroless plating method, a spin coating method, an ink jet method, a spray coating method, a stamping method, a micro contact printing method, a flexographic printing method, an offset printing method, a gravure printing method, a dipping method, and the like. Examples of a patterning method include chemical etching such as shadow masking, laser transfer, or photolithography and physical etching using an ultraviolet ray, a laser, and the like.

The drive circuit itself that drives the imaging element can have a known circuit configuration, and includes, for example, an amplification transistor, a reset transistor, and a selection transistor each having a known configuration and structure, and includes, for example, various registers and an analog-digital conversion circuit. The condenser can be constituted by a known lens or lens group. Furthermore, for example, a plurality of wiring layers including aluminum (Al), copper (Cu), or the like is formed, for example, above (on a light incident side of) the photoelectric conversion region or the like in order to drive the imaging element.

In a case where the photoelectric conversion region or the like is formed in the semiconductor layer or the semiconductor substrate, the control circuit and the drive circuit are disposed in the semiconductor substrate, or disposed in a semiconductor substrate different from the semiconductor layer or the semiconductor substrate in which the photoelectric conversion region or the like is formed. The drive circuit can include the control circuit.

The insulating film, and an interlayer insulating layer and an insulating layer (hereinafter, these may be collectively referred to as an "insulating film or the like") as described later are required to be transparent to incident light and not to have light absorption characteristics. Specific examples of a material constituting the insulating film or the like include not only an inorganic insulating material exemplified by a metal oxide high dielectric insulating material such as a silicon oxide-based material, silicon nitride ($SiN_y$); or aluminum oxide ($Al_2O_3$), but also an organic insulating material (organic polymer) exemplified by a straight chain hydrocarbon having a functional group capable of being bonded to a control electrode at one end, such as polymethyl methacrylate (PMMA), polyvinyl phenol (PVP), polyvinyl alcohol (PVA), polyimide; polycarbonate (PC), polyethylene terephthalate (PET), polystyrene, a silanol derivative (silane coupling agent) such as N-2 (aminoethyl) 3-aminopropyltrimethoxysilane (AEAPTMS), 3-mercaptopropyltrimethoxysilane (MPTMS), or octadecyl trichlorosilane (OTS), a novolac type phenol resin, a fluorine-based resin, octadecanethiol, or dodecyl isocyanate. A combination thereof can be also used. Examples of the silicon oxide-based material include silicon oxide (SiOx), BPSG, PSG, BSG, AsSG, PbSG, silicon oxynitride (SiON), spin on glass (SOG), a low dielectric constant insulating material (for example, polyaryl ether, cyclo perfluorocarbon polymer and benzocyclobutene, a cyclic fluorocarbon resin, polytetrafluoroethylene, fluorinated aryl ether, fluorinated polyimide, amorphous carbon, and organic SOG). The insulating film or the like can have a single-layer configuration or a configuration in which a plurality of layers (for example, two layers) is laminated. The insulating film or the like can be formed on the basis of a known method such as various CVD methods, a coating method, various PVD methods including a sputtering method and a vacuum vapor deposition method, various printing methods including a screen printing method, or a sol-gel method.

The imaging element can include a wavelength selection unit (specifically, for example, a known color filter layer) on a light incident side as necessary. One wavelength selection unit covers the M×N photoelectric conversion regions. In a case where an on-chip microlens includes a main on-chip microlens and a sub-on-chip microlens (OPA), and the main on-chip microlens is disposed above the sub-on-chip microlens (OPA), a wavelength selection unit (known color filter layer) can be disposed between the sub-on-chip microlens and the main on-chip microlens.

Examples of the color filter layer include a filter layer that transmits a specific wavelength such as red, green, blue, cyan, magenta, or yellow. The color filter layer can be constituted not only by an organic material-based color filter layer using an organic compound such as a pigment or a dye but also by a thin film containing an inorganic material such as a photonic crystal, a wavelength selection element that applies a plasmon (color filter layer having a conductor lattice structure with a lattice-like hole structure in a conductive thin film, for example, see Japanese Patent Application Laid-Open No. 2008-177191), or amorphous silicon.

A waveguide structure or a condenser tube structure may be disposed between the imaging element and the imaging element, and this can reduce optical crosstalk. Here, the waveguide structure is constituted by a thin film formed in a region (for example, a cylindrical region) located between the imaging element and the imaging element of the interlayer insulating layer covering the imaging element and having a refractive index value larger than a refractive index value of a material constituting the interlayer insulating layer. Light incident from above the imaging element is totally reflected by the thin film and reaches the imaging element. That is, an orthogonal projection image of the imaging element with respect to the base is located inside the orthogonal projection image of the thin film constituting the waveguide structure with respect to the base, and the orthogonal projection image of the imaging element with respect to the base is surrounded by the orthogonal projection image of the thin film constituting the waveguide structure with respect to the base. Furthermore, the condenser tube structure is constituted by a light-shielding thin film containing a metal material or an alloy material and formed in a region (for example, a cylindrical region) located between the imaging element and the imaging element of the interlayer insulating layer covering the imaging element. Light incident from above the imaging element is reflected by the thin film and reaches the imaging element. That is, the orthogonal projection image of the imaging element with respect to the base is located inside the orthogonal projection image of the thin film constituting the condenser tube structure with respect to the base, and the orthogonal projection image of the imaging element with respect to the base is surrounded by the orthogonal projection image of the thin film constituting the condenser tube structure with respect to the base.

An element isolation structure having a known configuration and structure is formed between the imaging element and the imaging element. A light-shielding groove may be further formed between the imaging element and the imaging element.

Examples of an array of the imaging elements include a Bayer array, an interline array, a G stripe RB checkered array, a G stripe RB complete checkered array, a checkered complementary color array, a stripe array, a diagonal stripe array, a primary color chrominance array, a field chrominance sequential array, a frame chrominance sequential array, a MOS-type array, an improved MOS-type array, a frame interleaved array, and a field interleaved array. Here, one imaging element (imaging element) constitutes one pixel (or sub-pixel). For example, in a case of the Bayer array, it is only required to dispose color filter layers of red, green, green, and blue in four sub-pixel regions in a 2×2 sub-pixel region, respectively. In a case where the purpose is not color separation or spectroscopy, or in an imaging element in which the imaging element itself has sensitivity to a specific wavelength, a color filter layer may be unnecessary. Furthermore, in a sub-pixel region where a color filter layer is not disposed, a transparent resin layer may be formed instead of the color filter layer in order to ensure flatness with the sub-pixel region where the color filter layer is disposed. That is, the imaging element may be constituted by a combination of a red light imaging element having sensitivity to red light, a green light imaging element having sensitivity to green light, and a blue light imaging element having sensitivity to blue light, may be constituted by a combination of these imaging elements and an infrared light imaging element having sensitivity to infrared light, may be formed into an imaging device that obtains a monochromatic image, or may be formed into an imaging device that obtains a combination of a monochromatic image and an image based on infrared light.

Example 1

Figure 1B:
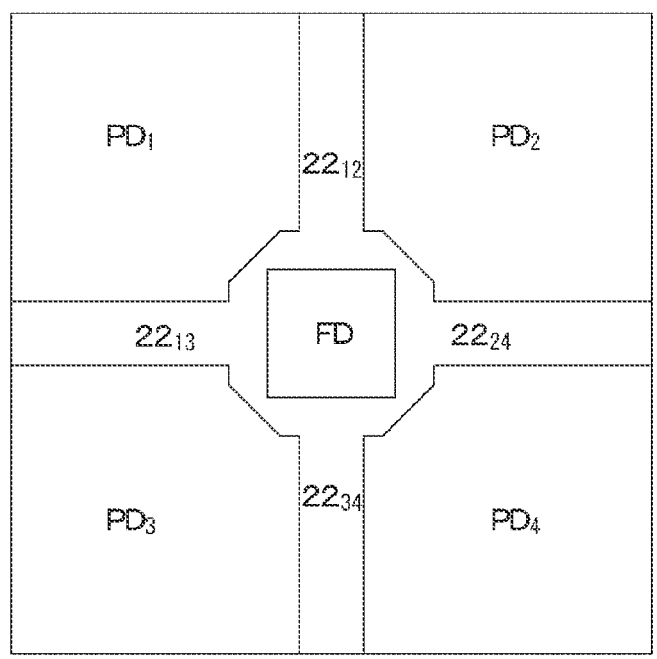
Figure 2A:
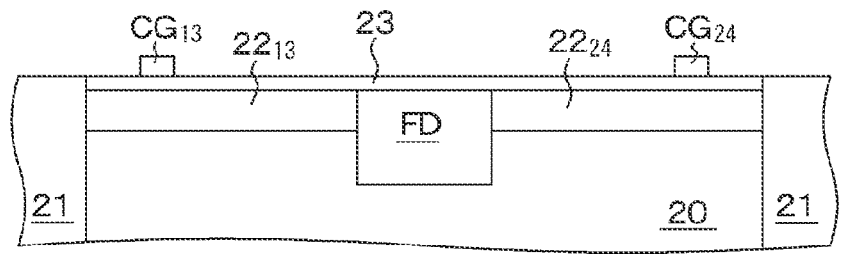
FIGS. 2A, 2B, 2C, and 2D are schematic end views of the imaging element along arrows A-A, B-B, C-C, and D-D in FIG. 1A, respectively.
Figure 2B:
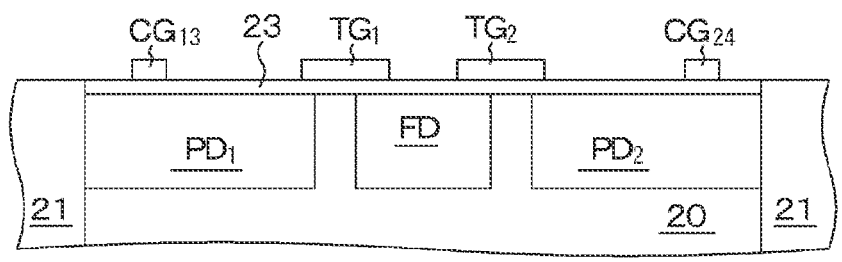
Figure 2C:
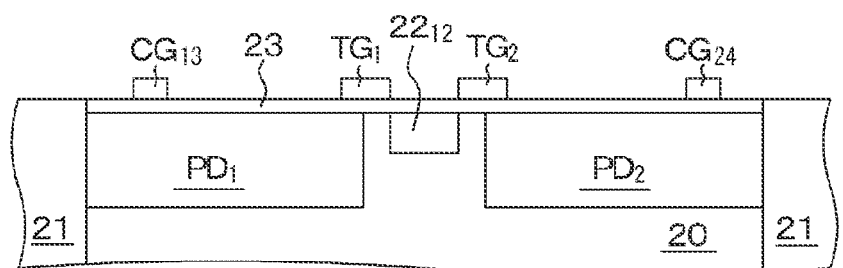
Figure 2D:
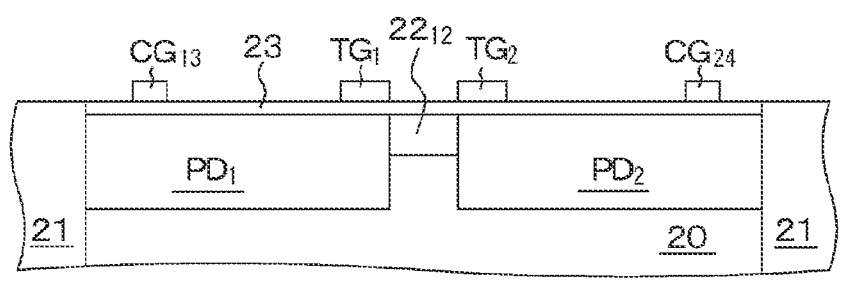
Figure 3:
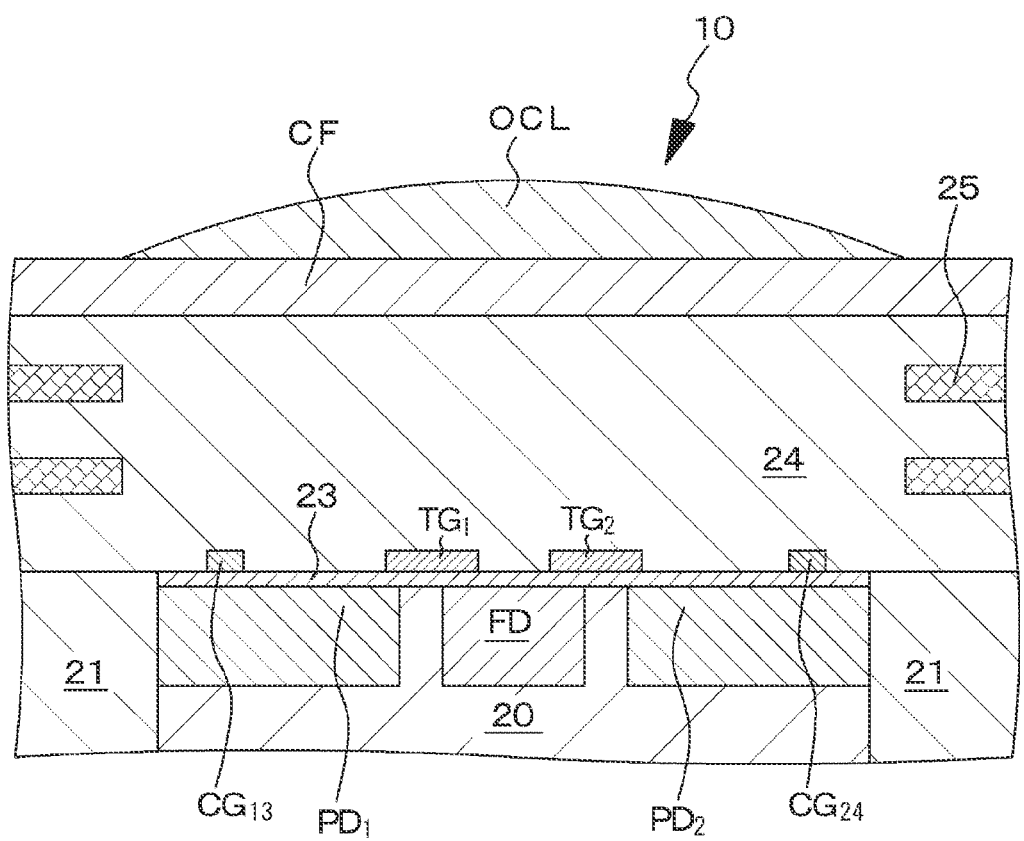
FIG. 3 is a schematic partial cross-sectional view of the imaging element (front irradiation type imaging element) of Example 1.
Figure 4:
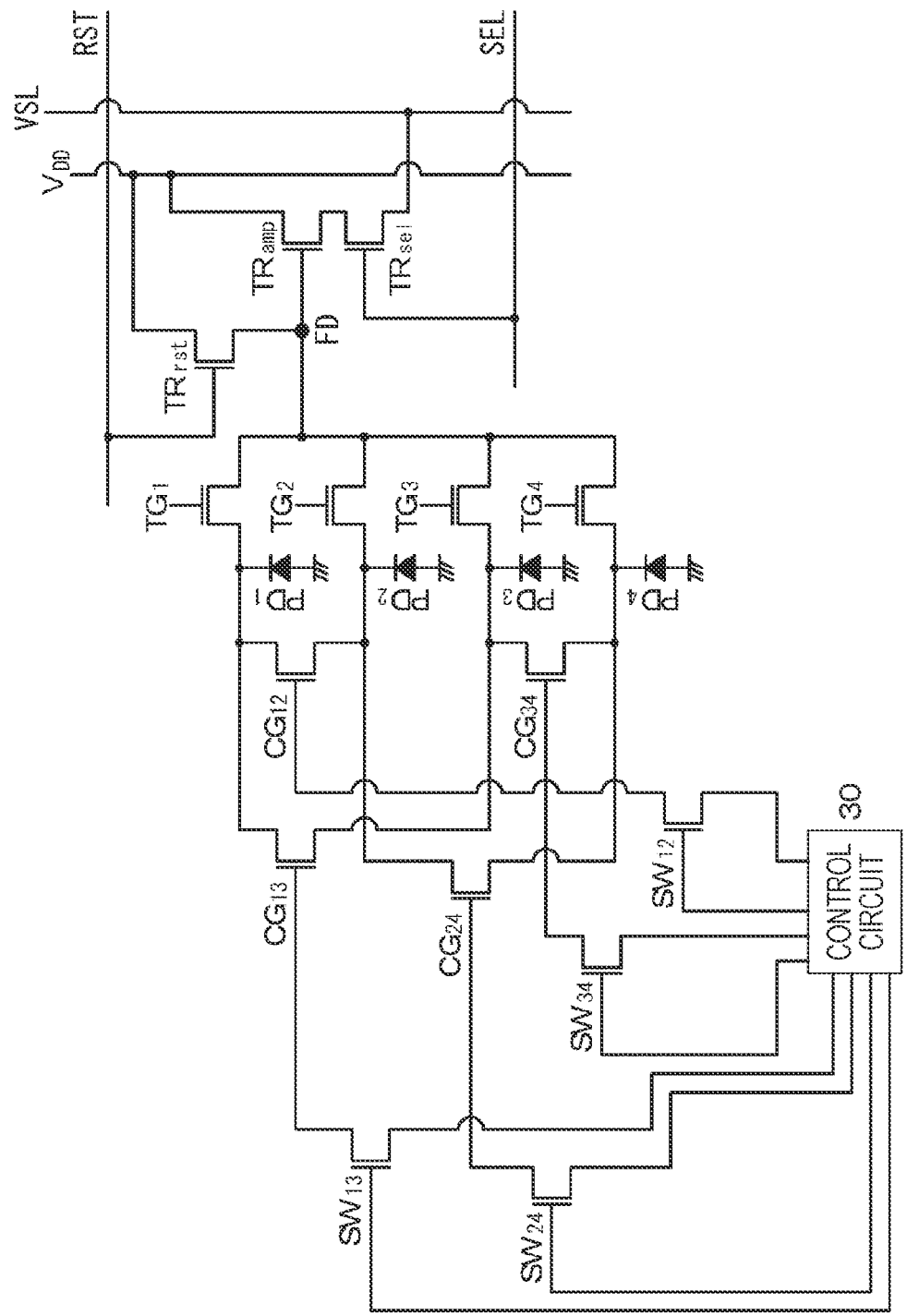
FIG. 4 is an equivalent circuit diagram of the imaging element of Example 1.
Figure 5:
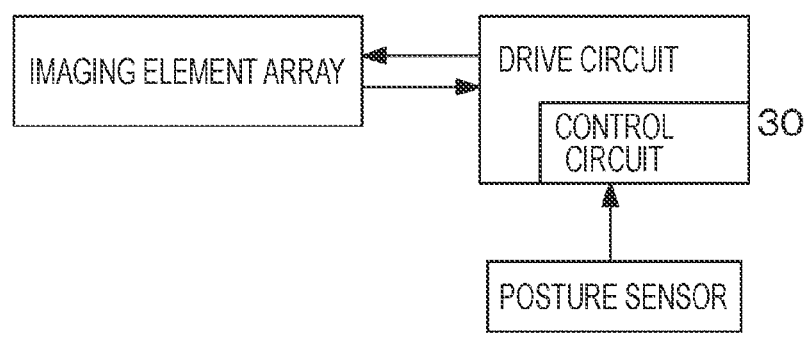
FIG. 5 is a conceptual diagram of the imaging device of Example 1.

Example 1 relates to the imaging element and the imaging device of the present disclosure. FIG. 1A schematically illustrates arrangement of a photoelectric conversion region, a floating diffusion layer, a transfer control electrode, a charge transfer control electrode, and a boundary region in the imaging element of Example 1, and FIG. 1B schematically illustrates arrangement of the photoelectric conversion region, the floating diffusion layer, and the boundary region. Furthermore, FIGS. 2A, 2B, 2C, and 2D illustrate schematic end views of the imaging element along arrows A-A, B-B, C-C, and D-D in FIG. 1A, respectively. Moreover, FIG. 3 illustrates a schematic partial cross-sectional view of the imaging element, FIG. 4 illustrates an equivalent circuit diagram of the imaging element, FIG. 5 illustrates a conceptual diagram of the imaging device, and FIGS. 6A, 6B, 7A, and 7B schematically illustrate operations of the transfer control electrode and the charge transfer control electrode and an obtained image signal. Note that hatching lines are omitted in FIGS. 2A, 2B, 2C, and 2D.

An imaging device of Example 1 or Examples 2 and 3 as described later includes a plurality of imaging elements 10, and each of the imaging elements 10 is constituted by the following imaging element of Example 1. Note that the imaging device further includes one condenser (not illustrated) that condenses incident light on the plurality of imaging elements 10.

That is, the imaging element 10 of Example 1 or Examples 2 and 3 as described later includes:

M×N photoelectric conversion regions PD arrayed such that M photoelectric conversion regions PD are arrayed in a first direction and N photoelectric conversion regions PD are arrayed in a second direction different from the first direction;

a floating diffusion layer FD shared by the M×N photoelectric conversion regions PD;

a transfer control electrode TG that is disposed corresponding to each of the photoelectric conversion regions PD and transfers charges generated in each of the photoelectric conversion regions PD to the floating diffusion layer FD;

(M−1)×N first charge transfer control electrodes CG that control charge transfer between the M photoelectric conversion regions PD arrayed in the first direction; and (N−1)×M second charge transfer control electrodes CG that control charge transfer between the N photoelectric conversion regions PD arrayed in the second direction. In addition, in the M photoelectric conversion regions PD arrayed in the first direction, an m-th first charge transfer control electrode CG [in which m is any integer of 1 to (M−1)] controls charge transfer between an m-th photoelectric conversion region PD and an (m+1)-th photoelectric conversion region PD, and in the N photoelectric conversion regions PD arrayed in the second direction, an n-th second charge transfer control electrode CG [in which n is any integer of 1 to (N−1)] controls charge transfer between an n-th photoelectric conversion region PD and an (n+1)-th photoelectric conversion region PD.

Here, in the imaging element 10 of Example 1, M=2 and N=2, and each of the imaging elements 10 includes:

a first photoelectric conversion region $PD_1$ and a second photoelectric conversion region $PD_2$ juxtaposed in the first direction, a third photoelectric conversion region $PD_3$ disposed adjacent to the first photoelectric conversion region $PD_1$ in the second direction, and a fourth photoelectric conversion region $PD_4$ disposed adjacent to the second photoelectric conversion region $PD_2$ and the third photoelectric conversion region $PD_3$, a floating diffusion layer FD shared by the first photoelectric conversion region $PD_1$, the second photoelectric conversion region $PD_2$, the third photoelectric conversion region $PD_3$, and the fourth photoelectric conversion region $PD_4$;

a first transfer control electrode $TG_1$ that transfers charges generated in the first photoelectric conversion region $PD_1$ to the floating diffusion layer FD;

a second transfer control electrode $TG_2$ that transfers charges generated in the second photoelectric conversion region $PD_2$ to the floating diffusion layer FD;

a third transfer control electrode $TG_3$ that transfers charges generated in the third photoelectric conversion region $PD_3$ to the floating diffusion layer FD;

a fourth transfer control electrode $TG_4$ that transfers charges generated in the fourth photoelectric conversion region $PD_4$ to the floating diffusion layer FD;

a first-A charge transfer control electrode $CG_{12}$ that controls charge transfer between the first photoelectric conversion region $PD_1$ and the second photoelectric conversion region $PD_2$;

a first-B charge transfer control electrode $CG_{34}$ that controls charge transfer between the third photoelectric conversion region $PD_3$ and the fourth photoelectric conversion region $PD_4$;

a second-A charge transfer control electrode $CG_{13}$ that controls charge transfer between the first photoelectric conversion region $PD_1$ and the third photoelectric conversion region $PD_3$; and a second-B charge transfer control electrode $CG_{24}$ that controls charge transfer between the second photoelectric conversion region $PD_2$ and the fourth photoelectric conversion region $PD_4$.

The first direction is preferably orthogonal to the second direction. Furthermore, the imaging element 10 is constituted by a CMOS image sensor, and the imaging device and the imaging element 10 are a front irradiation type imaging device and imaging element.

Furthermore, the imaging device of Example 1 further includes a control circuit 30. In addition, at the time of imaging, the control circuit 30 controls operations of the first charge transfer control electrodes $CG_{12}$ and $CG_{34}$ and the second charge transfer control electrodes $CG_{13}$ and $CG_{24}$ in a first mode in which the first charge transfer control electrodes $CG_{12}$ and $CG_{34}$ are turned into an inoperative state when the second charge transfer control electrodes $CG_{13}$ and $CG_{24}$ are in an operative state, and in a second mode in which the second charge transfer control electrode $CG_{13}$ and $CG_{24}$ are turned into an inoperative state when the first charge transfer control electrodes $CG_{12}$ and $CG_{34}$ are in an operative state.

The control circuit 30 switches between the first mode and the second mode on the basis of posture information of the imaging device. In this case, the posture information of the imaging device is information indicating that the imaging device is located in a lateral direction and information indicating that the imaging device is located in a longitudinal direction. Note that, in a case where the imaging device is located in a lateral direction, the operation is performed in the first mode, and in a case where the imaging device is located in a longitudinal direction, the operation is performed in the second mode. Switching between the first mode and the second mode, that is, whether the imaging device is located in a lateral direction or in a longitudinal direction can be detected by, for example, a known posture sensor incorporated in the imaging device. Alternatively, an operator of the imaging device can switch between the first mode and the second mode by operating a switch or the like disposed in the imaging device.

Furthermore, in order to ensure charge transfer between the photoelectric conversion regions or suppression of the transfer, a maximum value of an impurity concentration in a boundary region 22 located between the photoelectric conversion region PD and the photoelectric conversion region PD is lower than a maximum value of an impurity concentration in the photoelectric conversion regions PD. Alternatively, a depth at which the impurity concentration in the boundary region 22 located between the photoelectric conversion region PD and the photoelectric conversion region PD indicates the maximum value is shallower than a depth at which the impurity concentration in the photoelectric conversion region PD indicates the maximum value. Furthermore, the width of the boundary region 22 located between the photoelectric conversion region PD and the photoelectric conversion region PD is narrower than the width of the photoelectric conversion region PD. Note that, in the drawings, a boundary region located between the photoelectric conversion region $PD_1$ and the photoelectric conversion region $PD_2$ is indicated by a boundary region $22_{12}$, a boundary region located between the photoelectric conversion region $PD_1$ and the photoelectric conversion region $PD_3$ is indicated by a boundary region $22_{13}$, a boundary region located between the photoelectric conversion region $PD_2$ and the photoelectric conversion region $PD_4$ is indicated by a boundary region $22_{24}$, and a boundary region located between the photoelectric conversion region $PD_3$ and the photoelectric conversion region $PD_4$ is indicated by a boundary region $22_{34}$.

In a part of the boundary region 22, various transistors constituting the control circuit 30 and the drive circuit, and a switch circuit as described later may be disposed as necessary.

In the imaging device of Example 1, an operating voltage of the (M−1)×N first charge transfer control electrodes CG is the same as an operating voltage of the (N−1)×M second charge transfer control electrodes CG. This can simplify a circuit configuration of the imaging device.

As FIG. 3 illustrates a schematic partial cross-sectional view of the imaging element, an interlayer insulating layer 24 is formed above the photoelectric conversion region PD or the like. A wavelength selection unit is disposed on a light incident side. Specifically, a known color filter layer CF is formed on the interlayer insulating layer 24. An on-chip microlens (OCL) is disposed on the color filter layer CF (in some cases, on a smoothing layer formed on the color filter layer CF). Various wiring layers 25 are disposed in the interlayer insulating layer 24 in order to drive the imaging element.

The photoelectric conversion region PD, the floating diffusion layer FD, and the boundary region 22 are formed in a base 20 constituted by a semiconductor substrate. The configurations and structures of the photoelectric conversion region PD and the floating diffusion layer FD can be known configurations and structures. The base 20 is constituted by a silicon semiconductor substrate. An element isolation structure 21 having a known configuration and structure is formed in the base 20 between the imaging element 10 and the imaging element 10.

The transfer control electrode TG is connected to the drive circuit, and by applying an appropriate voltage from the drive circuit to the transfer control electrode TG, charges generated in the photoelectric conversion region PD can be transferred to the floating diffusion layer FD. The transfer control electrode TG is disposed so as to face a region of the base 20 located between the photoelectric conversion region PD and the floating diffusion layer FD with an insulating film 23 interposed therebetween. The charge transfer control electrode CG is connected to the control circuit 30, and by applying an appropriate voltage from the control circuit 30 to the charge transfer control electrode CG, charge transfer between adjacent photoelectric conversion regions PD can be controlled. The charge transfer control electrode CG is disposed so as to face a region (a part of the boundary region 22) of the base 20 located between adjacent photoelectric conversion regions PD with the insulating film 23 interposed therebetween. The planar shapes of the transfer control electrode TG and the charge transfer control electrode CG are essentially arbitrary, and it is only required to appropriately determine the planar shapes according to specifications required for the imaging element 10. In the illustrated example, the planar shape of the charge transfer control electrode CG is a ring shape (half ring shape) in which a part is cut out. The control circuit 30 and the drive circuit are disposed in the base 20. The drive circuit includes the control circuit 30.

Figure 14A:
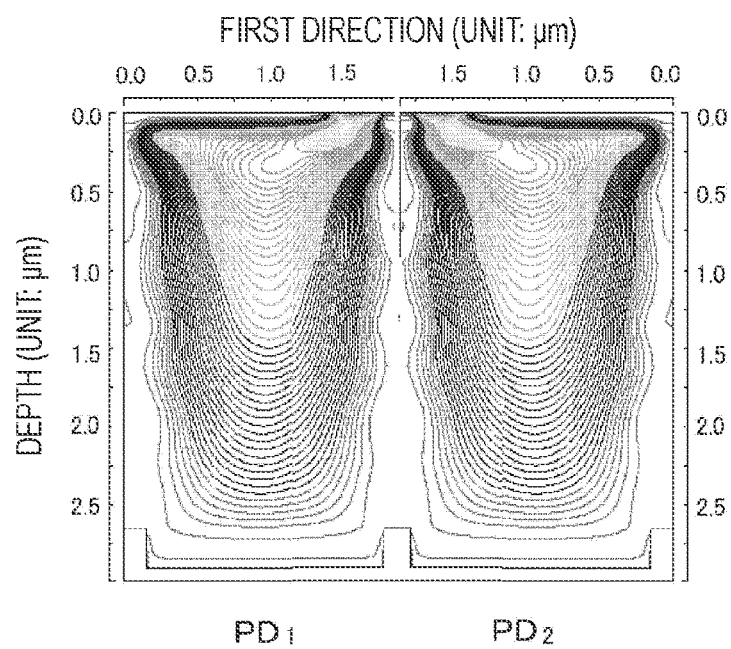
FIGS. 14A and 14B are a diagram illustrating a potential distribution in a photoelectric conversion region and a boundary region when a first-A charge transfer control electrode that controls charge transfer between a first photoelectric conversion region and a second photoelectric conversion region is in an operative state, and a diagram illustrating a potential distribution in a photoelectric conversion region and a boundary region when the first-A charge transfer control electrode that controls charge transfer between the first photoelectric conversion region and the second photoelectric conversion region is in an inoperative state, respectively, in the imaging element of Example 1.
Figure 14B:
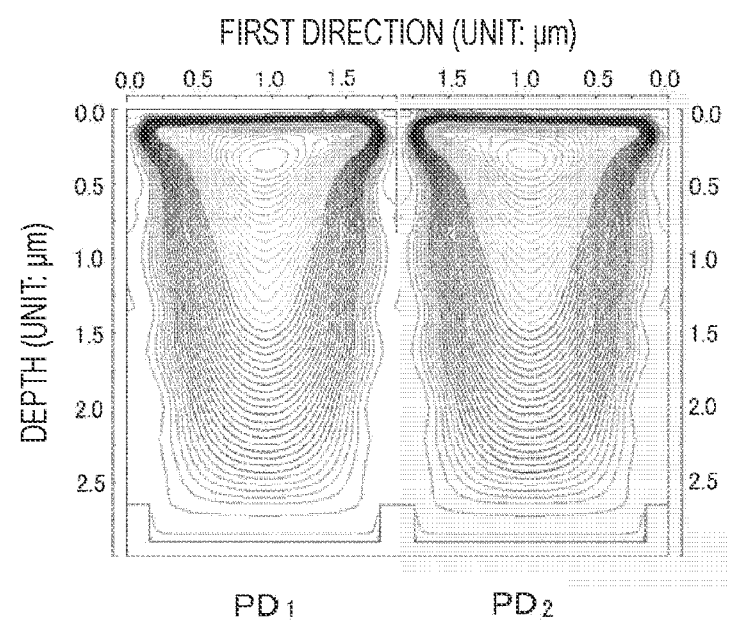
Figure 15A:
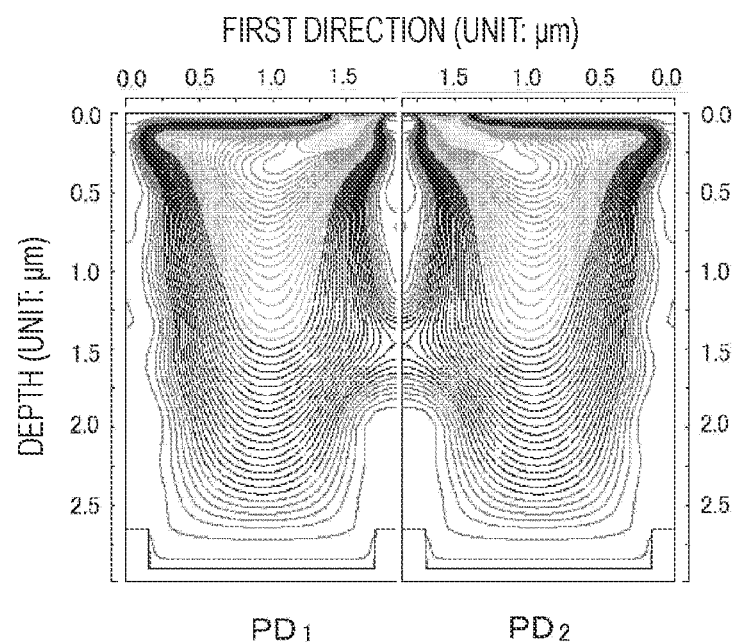
FIGS. 15A and 15B are a diagram illustrating a potential distribution in a photoelectric conversion region and a boundary region when a first-A charge transfer control electrode that controls charge transfer between a first photoelectric conversion region and a second photoelectric conversion region is in an operative state, and a diagram illustrating a potential distribution in a photoelectric conversion region and a boundary region when the first-A charge transfer control electrode that controls charge transfer between the first photoelectric conversion region and the second photoelectric conversion region is in an inoperative state, respectively, in the imaging element of Example 1.
Figure 15B:
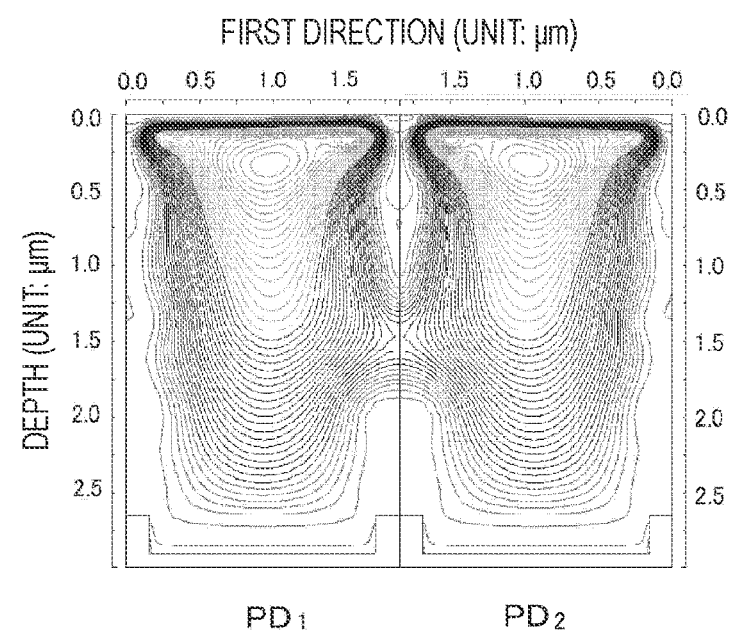

FIGS. 14A and 15A each illustrate a potential distribution in the photoelectric conversion region PD and the boundary region 22 when the first-A charge transfer control electrode $CG_{24}$ that controls charge transfer between the first photoelectric conversion region $PD_1$ and the second photoelectric conversion region $PD_2$ is in an operative state Furthermore, FIGS. 14B and 15B each illustrate a potential distribution in the photoelectric conversion region PD and the boundary region 22 when the first-A charge transfer control electrode $CG_{12}$ that controls charge transfer between the first photoelectric conversion region $PD_1$ and the second photoelectric conversion region $PD_2$ is in an inoperative state. Note that FIGS. 14A, 14B, 15A, and 15B each illustrate a potential distribution in a substantially similar cross section to that taken along arrow D-D in FIG. 1A.

Figure 16:
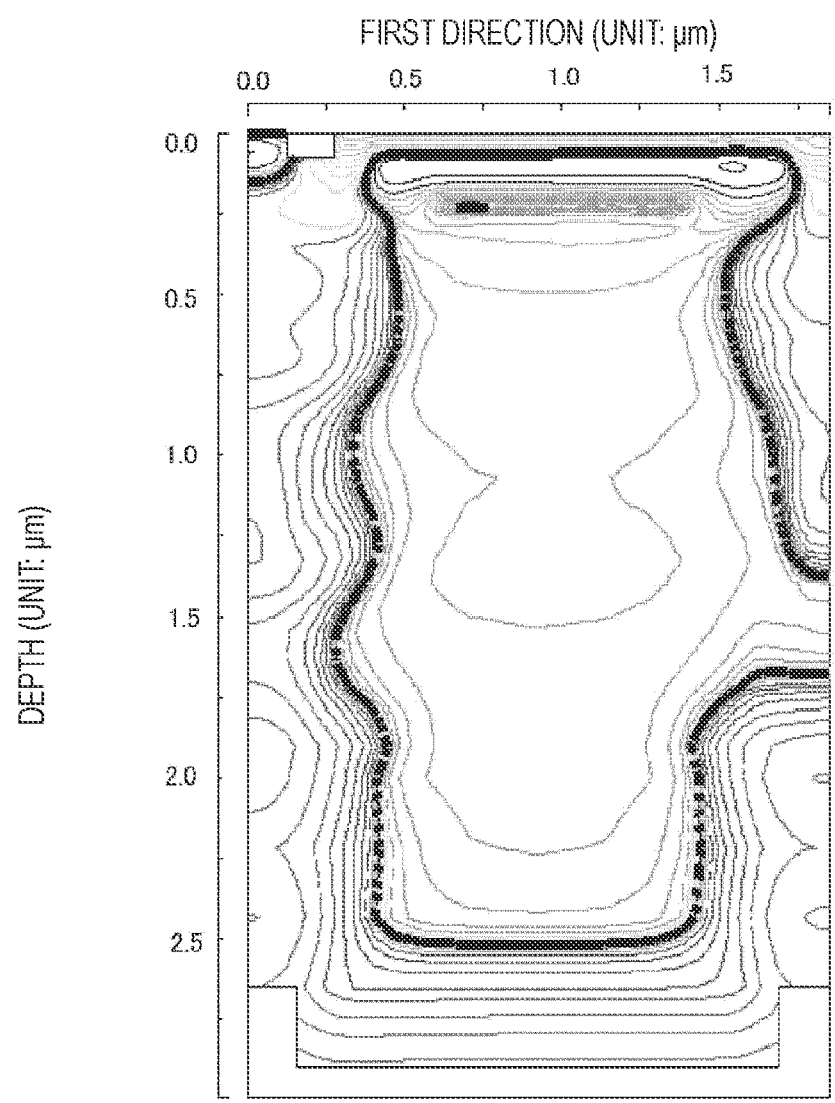
FIG. 16 is a diagram illustrating an impurity concentration distribution in a photoelectric conversion region and a boundary region in the imaging element of Example 1.

FIGS. 14A and 15A indicate that a weak barrier is formed between a surface region of the first photoelectric conversion region $PD_1$ and a surface region of the second photoelectric conversion region $PD_2$ when the first-A charge transfer control electrode $CG_{24}$ is in an operative state. Meanwhile, FIGS. 14B and 15B indicate that a strong barrier is formed between a surface region of the first photoelectric conversion region $PD_1$ and a surface region of the second photoelectric conversion region $PD_2$ when the first-A charge transfer control electrode $CG_{24}$ is in an inoperative state. Note that a difference between FIG. 14A and FIG. 15A is as follows. That is, in FIG. 14A, charge transfer is not possible in the vicinity of the depth of 1.5 μm, whereas in FIG. 15A, charge transfer is possible in the vicinity of the depth of 1.5 μm. That is, when FIG. 14A is compared with FIG. 15A, charge transfer more easily occurs in FIG. 15A. Furthermore, a difference between FIG. 14B and FIG. 15B is as follows. That is, in FIG. 14B, charge transfer is not possible in the vicinity of the depth of 1.5 μm, whereas in FIG. 15B, charge transfer is possible in the vicinity of the depth of 1.5 μm. That is, when FIG. 14B is compared with FIG. 15B, charge transfer occurs less frequently (a strong barrier is formed) in FIG. 14B. Moreover, FIG. 16 illustrates an impurity concentration distribution in the photoelectric conversion region PD and the boundary region 22.

In the imaging element of Example 1, the element isolation structure 21 is formed in the base 20 constituted by a silicon semiconductor substrate, and various transistors constituting the drive circuit are further formed in the base 20. Furthermore, the photoelectric conversion region PD, the boundary region 22, and the floating diffusion layer FD are formed in the base 20 on the basis of, for example, an ion implantation method. Then, the insulating film 23 is formed on the entire surface, and then the transfer control electrode TG facing a region of the base 20 located between the photoelectric conversion region PD and the floating diffusion layer FD with the insulating film 23 interposed therebetween is disposed on the basis of a known method. In addition, the charge transfer control electrode CG facing a region of the base 20 (a part of the boundary region 22) located between adjacent photoelectric conversion regions PD with the insulating film 23 interposed therebetween is disposed on the basis of a known method. Thereafter, the interlayer insulating layer 24 is formed on the entire surface, and the wiring layer 25 is formed in the interlayer insulating layer 24. Then, the color filter layer CF is formed on the interlayer insulating layer 24, and an on-chip microlens (OCL) is disposed on the color filter layer CF. In this way, the front irradiation type imaging element of Example 1 can be obtained.

As FIG. 4 illustrates an equivalent circuit diagram, a switch circuit $SW_{12}$ for controlling an operation of the first-A charge transfer control electrode $CG_{12}$ is disposed between the first-A charge transfer control electrode $CG_{12}$ and the control circuit 30. Furthermore, a switch circuit $SW_{34}$ for controlling an operation of the first-B charge transfer control electrode $CG_{34}$ is disposed between the first-B charge transfer control electrode $CG_{34}$ and the control circuit 30. Moreover, a switch circuit $SW_{13}$ for controlling an operation of the second-A charge transfer control electrode $CG_{13}$ is disposed between the second-A charge transfer control electrode $CG_{13}$ and the control circuit 30. Furthermore, a switch circuit $SW_{24}$ for controlling an operation of the second-B charge transfer control electrode $CG_{24}$ is disposed between the second-B charge transfer control electrode $CG_{24}$ and the control circuit 30. The switch circuit SW is constituted by a known FET. The switch circuit SW is included, for example, in the control circuit 30.

Hereinafter, an operation of an imaging element in an imaging device at a lateral position at the time of imaging, that is, a method for driving an imaging element will be described. This driving method (method for acquiring an image signal) is specifically a method for driving an imaging element including:

M×N photoelectric conversion regions PD arrayed such that M photoelectric conversion regions PD are arrayed in a first direction and N photoelectric conversion regions PD are arrayed in a second direction different from the first direction;

a floating diffusion layer FD shared by the M×N photoelectric conversion regions PD;

a transfer control electrode TG that is disposed corresponding to each of the photoelectric conversion regions PD and transfers charges generated in each of the photoelectric conversion regions PD to the floating diffusion layer FD;

(M−1)×N first charge transfer control electrodes CG that control charge transfer between the M photoelectric conversion regions PD arrayed in the first direction; and (N−1)×M second charge transfer control electrodes CG that control charge transfer between the N photoelectric conversion regions PD arrayed in the second direction, the method including:

accumulating charges in the M×N photoelectric conversion regions PD on the basis of photoelectric conversion; and then in the M photoelectric conversion regions PD arrayed in the first direction, operating an m-th first charge transfer control electrode [in which m is any integer of 1 to (M−1)] to transfer charges between an m-th photoelectric conversion region $PD_{(m, n)}$ and an (m+1)-th photoelectric conversion region $PD_{(m+1, n)}$, in the N photoelectric conversion regions PD arrayed in the second direction, not operating an n-th second charge transfer control electrode [in which n is any integer of 1 to (N−1)] to suppress charge transfer between an n-th photoelectric conversion region $PD_{(m, n)}$ and an (n+1)-th photoelectric conversion region $PD_{(m, n+1)}$, and subsequently, sequentially determining an image signal from the N sets of M photoelectric conversion regions PD arrayed in the first direction via the transfer control electrode TG and the floating diffusion layer FD, or accumulating charges in the M×N photoelectric conversion regions PD on the basis of photoelectric conversion; and then in the M photoelectric conversion regions PD arrayed in the first direction, not operating an m-th first charge transfer control electrode [in which m is any integer of 1 to (M−1)] to suppress charges between an m-th photoelectric conversion region $PD_{(m, n)}$ and an (m+1)-th photoelectric conversion region $PD_{(m+1, n)}$; in the N photoelectric conversion regions PD arrayed in the second direction, operating an n-th second charge transfer control electrode [in which n is any integer of 1 to (N−1)] to transfer charges between an n-th photoelectric conversion region $PD_{(m, n)}$ and an (n+1)-th photoelectric conversion region $PD_{(m, n+1)}$, and subsequently, sequentially determining an image signal from the M sets of N photoelectric conversion regions PD arrayed in the second direction via the transfer control electrode TG and the floating diffusion layer FD.

Specifically, first, an operation (first mode) of the imaging element in the imaging device at a lateral position at the time of imaging will be described.

[Accumulation of Charges in Photoelectric Conversion Region]

In imaging, first, the photoelectric conversion region PD receives light, and charges are accumulated in the photoelectric conversion region PD.

[First Discharge of Charges in Floating Diffusion Layer]

Subsequently, or at the same time as the accumulation of charges in the photoelectric conversion region PD, or before start of the accumulation of charges in the photoelectric conversion region PD, a reset transistor $TR_{RST}$ is turned into an on-state to discharge charges remaining in the floating diffusion layer FD to the outside of the system.

[First Transmission of Image Signal]

Figure 6A:
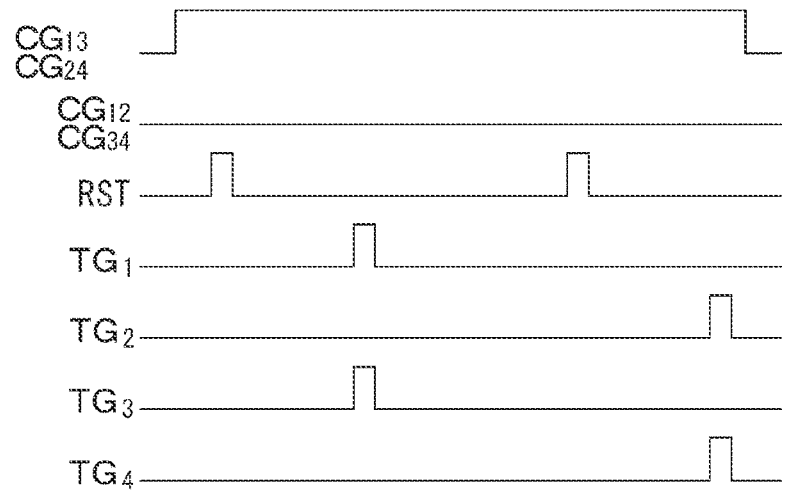
FIGS. 6A and 6B are a diagram schematically illustrating operations of a transfer control electrode and a charge transfer control electrode of the imaging element in the imaging device of Example 1 at a lateral position, and a diagram schematically illustrating an obtained image signal, respectively.
Figure 6B:
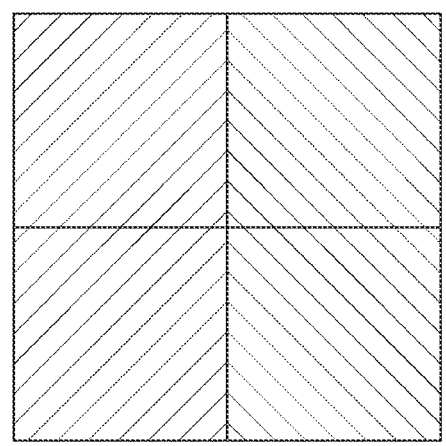

Thereafter, under control of the control circuit 30, in imaging in the first mode, the switch circuits $SW_{13}$ and $SW_{24}$ are turned into an on-state, and the second charge transfer control electrodes $CG_{13}$ and $CG_{24}$ are turned into an operative state. Meanwhile, the switch circuits $SW_{12}$ and $SW_{34}$ are turned into an off-state, and the first charge transfer control electrodes $CG_{12}$ and $CG_{34}$ are turned into an inoperative state. As a result, charge transfer between the first photoelectric conversion region $PD_1$ and the third photoelectric conversion region $PD_3$ and charge transfer between the second photoelectric conversion region $PD_2$ and the fourth photoelectric conversion region $PD_4$ occur. FIG. 6B schematically illustrates an obtained image signal. Note that the image signal is conceptually illustrated by hatching. This also applies to the following. Subsequently, as FIG. 6A schematically illustrates operations of the transfer control electrode TG and the charge transfer control electrode CG in the imaging element of Example 1 at a lateral position, the first transfer control electrode $TG_1$ and the third transfer control electrode $TG_3$ are turned into an on-state to transfer charges accumulated in the first photoelectric conversion region $PD_1$ and the third photoelectric conversion region $PD_3$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Second Discharge of Charges in Floating Diffusion Layer]

Subsequently, the reset transistor $TR_{RST}$ is turned into an on-state again to discharge charges remaining in the floating diffusion layer FD to the outside of the system.

[Second Transmission of Image Signal]

Thereafter, as illustrated in FIG. 6A, the second transfer control electrode $TG_2$ and the fourth transfer control electrode $TG_4$ are turned into an on-state to transfer charges accumulated in the second photoelectric conversion region $PD_2$ and the fourth photoelectric conversion region $PD_4$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Focus Detection Based on Phase Difference from Image Signal]

Then, on the basis of a phase difference between the image signal based on the charges accumulated in the first photoelectric conversion region $PD_1$ and the third photoelectric conversion region $PD_3$ and the image signal based on the charges accumulated in the second photoelectric conversion region $PD_2$ and the fourth photoelectric conversion region $PD_4$, focus detection in the imaging device at a lateral position is performed by a known method. Note that whether to first transfer the charges accumulated in the first photoelectric conversion region $PD_1$ and the third photoelectric conversion region $PD_3$ or first transfer the charges accumulated in the second photoelectric conversion region $PD_2$ and the fourth photoelectric conversion region $PD_4$ is essentially arbitrary.

Next, an operation (second mode) of the imaging element in the imaging device at a longitudinal position at the time of imaging will be described.

[Accumulation of Charges in Photoelectric Conversion Region]

In a similar manner to the above, charges are accumulated in the photoelectric conversion region PD.

[First Discharge of Charges in Floating Diffusion Layer]

Subsequently, in a similar manner to the above, first discharge of charges in the floating diffusion layer FD is executed.

[First Transmission of Image Signal]

Figure 7A:
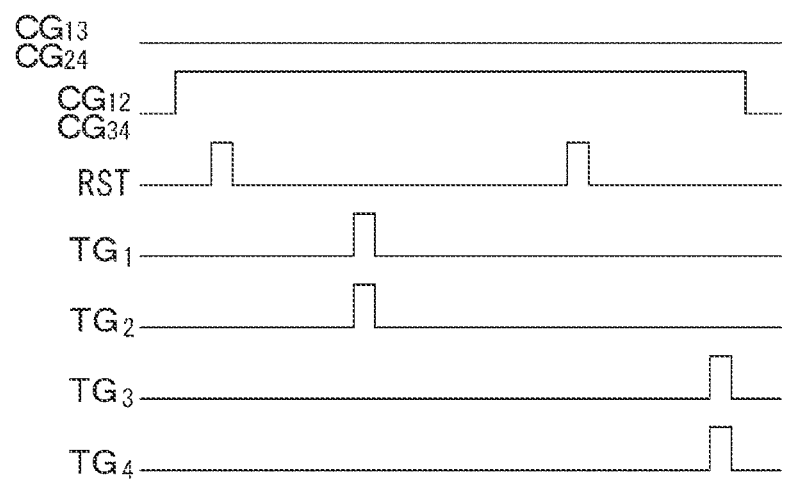
FIGS. 7A and 7B are a diagram schematically illustrating operations of a transfer control electrode and a charge transfer control electrode of the imaging element in the imaging device of Example 1 at a longitudinal position, and a diagram schematically illustrating an obtained image signal, respectively.
Figure 7B:
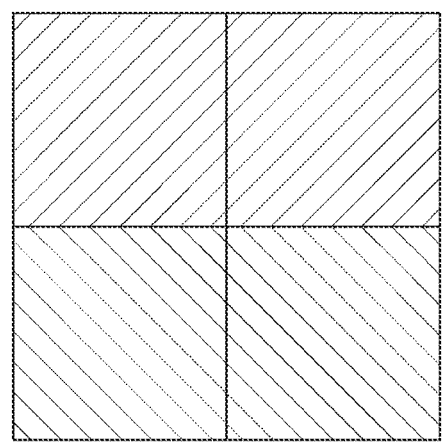

Thereafter, under control of the control circuit 30, in imaging in the second mode, the switch circuits $SW_{12}$ and $SW_{34}$ are turned into an on-state, and the first charge transfer control electrodes $CG_{12}$ and $CG_{34}$ are turned into an operative state. Meanwhile, the switch circuits $SW_{13}$ and $SW_{24}$ are turned into an off-state, and the second charge transfer control electrodes $CG_{13}$ and $CG_{24}$ are turned into an inoperative state. As a result, charge transfer between the first photoelectric conversion region $PD_1$ and the second photoelectric conversion region $PD_2$ and charge transfer between the third photoelectric conversion region $PD_3$ and the fourth photoelectric conversion region $PD_4$ occur. FIG. 7B schematically illustrates an obtained image signal. Subsequently, as FIG. 7A schematically illustrates operations of the transfer control electrode TG and the charge transfer control electrode CG in the imaging element of Example 1 at a longitudinal position, the first transfer control electrode $TG_1$ and the second transfer control electrode $TG_2$ are turned into an on-state to transfer charges accumulated in the first photoelectric conversion region $PD_1$ and the second photoelectric conversion region $PD_2$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Second Discharge of Charges in Floating Diffusion Layer]

Subsequently, the reset transistor $TR_{RST}$ is turned into an on-state again to discharge charges remaining in the floating diffusion layer FD to the outside of the system.

[Second Transmission of Image Signal]

Thereafter, as illustrated in FIG. 7A, the third transfer control electrode $TG_3$ and the fourth transfer control electrode $TG_4$ are turned into an on-state to transfer charges accumulated in the third photoelectric conversion region $PD_3$ and the fourth photoelectric conversion region $PD_4$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Focus Detection Based on Phase Difference from Image Signal]

Then, on the basis of a phase difference between the image signal based on the charges accumulated in the first photoelectric conversion region $PD_1$ and the second photoelectric conversion region $PD_2$ and the image signal based on the charges accumulated in the third photoelectric conversion region $PD_3$ and the fourth photoelectric conversion region $PD_4$, focus detection in the imaging device at a longitudinal position is performed by a known method. Note that whether to first transfer the charges accumulated in the first photoelectric conversion region $PD_1$ and the second photoelectric conversion region $PD_2$ or first transfer the charges accumulated in the third photoelectric conversion region $PD_3$ and the fourth photoelectric conversion region $PD_4$ is essentially arbitrary.

As described above, in Example 1, regardless of the position of the imaging device (the position in a lateral direction and the position in a longitudinal direction), the imaging device can perform focus detection on the basis of a phase difference from an image signal in all the imaging elements each including the photoelectric conversion regions arrayed in the first direction and the second direction. Therefore, it is possible to provide an imaging device capable of more accurately performing focus detection, and an imaging element suitable for being incorporated in the imaging device.

For example, assuming that charges accumulated in the first photoelectric conversion region and the second photoelectric conversion region are simultaneously transferred to the floating diffusion layer simply without disposing the charge transfer control electrode, for example, in a case where excessive charges are generated in the first photoelectric conversion region and overflow occurs in charge accumulation in the first photoelectric conversion region, when charges accumulated in the first photoelectric conversion region and the second photoelectric conversion region are simultaneously transferred to the floating diffusion layer, the amount of charges transferred to the floating diffusion layer is smaller than the sum of the amounts of charges generated in the first photoelectric conversion region and the second photoelectric conversion region. Meanwhile, in the present disclosure, accumulation of charges in the first photoelectric conversion region and the second photoelectric conversion region is averaged in a sense by an operation of the first charge transfer control electrode $CG_{12}$. Therefore, for example, even if excessive charges are generated in the first photoelectric conversion region, overflow is less likely to occur in charge accumulation in the first photoelectric conversion region. Therefore, the amount of charges generated in the first photoelectric conversion region and the second photoelectric conversion region can be reliably transferred to the floating diffusion layer. As a result, the accuracy of focus detection of the imaging device can be improved on the basis of a phase difference from an image signal. Furthermore, it is possible to reliably perform focus detection of the imaging device in a dark place.

Example 2

Figure 8A:
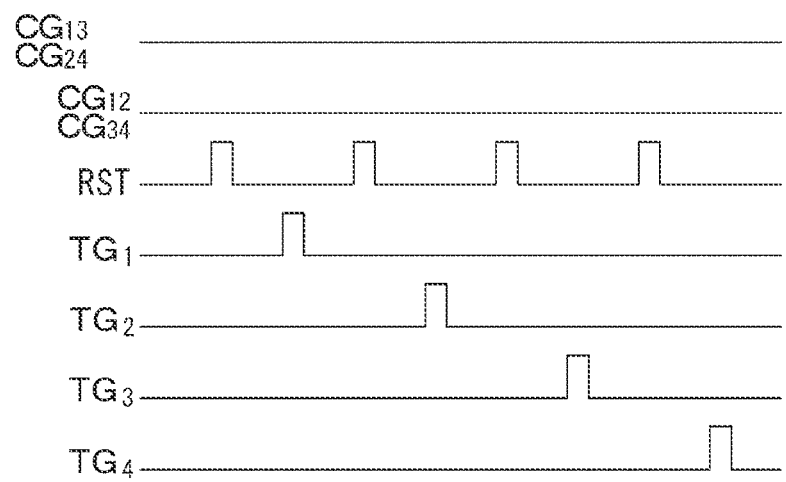
FIGS. 8A and 8B are a diagram schematically illustrating operations of a transfer control electrode and a charge transfer control electrode of an imaging element of Example 2 in quadruple density driving, and a diagram schematically illustrating an obtained image signal, respectively.
Figure 8B:
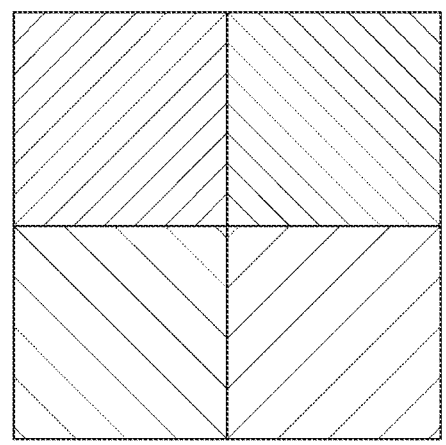

Example 2 is a modification of Example 1. In Example 2, at the time of imaging, the control circuit 30 further controls operations of the first charge transfer control electrodes $CG_{12}$ and $CG_{34}$ and the second charge transfer control electrodes $CG_{13}$ and $CG_{24}$ in a third mode in which the first charge transfer control electrodes $CG_{12}$ and $CG_{34}$ and the second charge transfer control electrodes $CG_{13}$ and $CG_{24}$ are turned into an inoperative state. By operating a switch or the like disposed in the imaging device, an operator of the imaging device can switch a mode from the first mode or the second mode to the third mode, or can switch a mode from the third mode to the first mode or the second mode. Not that in the third mode, focus detection based on a phase difference from an image signal is not performed. FIGS. 8A and 8B schematically illustrate operations of a transfer control electrode and a charge transfer control electrode of an imaging element of Example 2 in quadruple density driving, and an obtained image signal, respectively.

Specifically, first, in a similar manner to the above, charges are accumulated in the photoelectric conversion region PD. Note that all the switch circuits $SW_{12}$, $SW_{34}$, $SW_{13}$, and $SW_{24}$ are kept in an off-state.

[First Discharge of Charges in Floating Diffusion Layer]

Subsequently, in a similar manner to the above, first discharge of charges in the floating diffusion layer is executed.

[First Transmission of Image Signal]

Thereafter, under control of the control circuit 30, an operation of first transmission of an image signal is performed. In this case, the first transfer control electrode $TG_1$ is turned into an on-state to transfer charges generated in the first photoelectric conversion region $PD_1$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Second Discharge of Charges in Floating Diffusion Layer]

Subsequently, the reset transistor $TR_{RST}$ is turned into an on-state again to discharge charges remaining in the floating diffusion layer FD to the outside of the system.

[Second Transmission of Image Signal]

Thereafter, under control of the control circuit 30, an operation of second transmission of an image signal is performed. In this case, the second transfer control electrode $TG_2$ is turned into an on-state to transfer charges generated in the second photoelectric conversion region $PD_2$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Third Discharge of Charges in Floating Diffusion Layer]

Subsequently, the reset transistor $TR_{RST}$ is turned into an on-state again to discharge charges remaining in the floating diffusion layer FD to the outside of the system.

[Third Transmission of Image Signal]

Thereafter, under control of the control circuit 30, an operation of third transmission of an image signal is performed. In this case, the third transfer control electrode $TG_3$ is turned into an on-state to transfer charges generated in the third photoelectric conversion region $PD_3$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

[Fourth Discharge of Charges in Floating Diffusion Layer]

Subsequently, the reset transistor $TR_{RST}$ is turned into an on-state again to discharge charges remaining in the floating diffusion layer FD to the outside of the system.

[Fourth Transmission of Image Signal]

Thereafter, under control of the control circuit 30, an operation of fourth transmission of an image signal is performed. In this case, the fourth transfer control electrode $TG_4$ is turned into an on-state to transfer charges generated in the fourth photoelectric conversion region $PD_4$ to the floating diffusion layer FD. The charges transferred to the floating diffusion layer FD are transmitted to a signal line (data output line) VSL as an image signal on the basis of operations of an amplification transistor $TR_{amp}$ and a selection transistor $TR_{sel}$ under control of the drive circuit on the basis of a known method.

The configurations and structures of the imaging device and the imaging element 10 of Example 2 can be similar to those of the imaging device and the imaging element 10 of Example 1 except for the above points, and therefore detailed description thereof will be omitted. Note that the order in which charge transfer is performed from a photoelectric conversion region PD to the floating diffusion layer FD is essentially arbitrary.

Example 3

Figure 9:
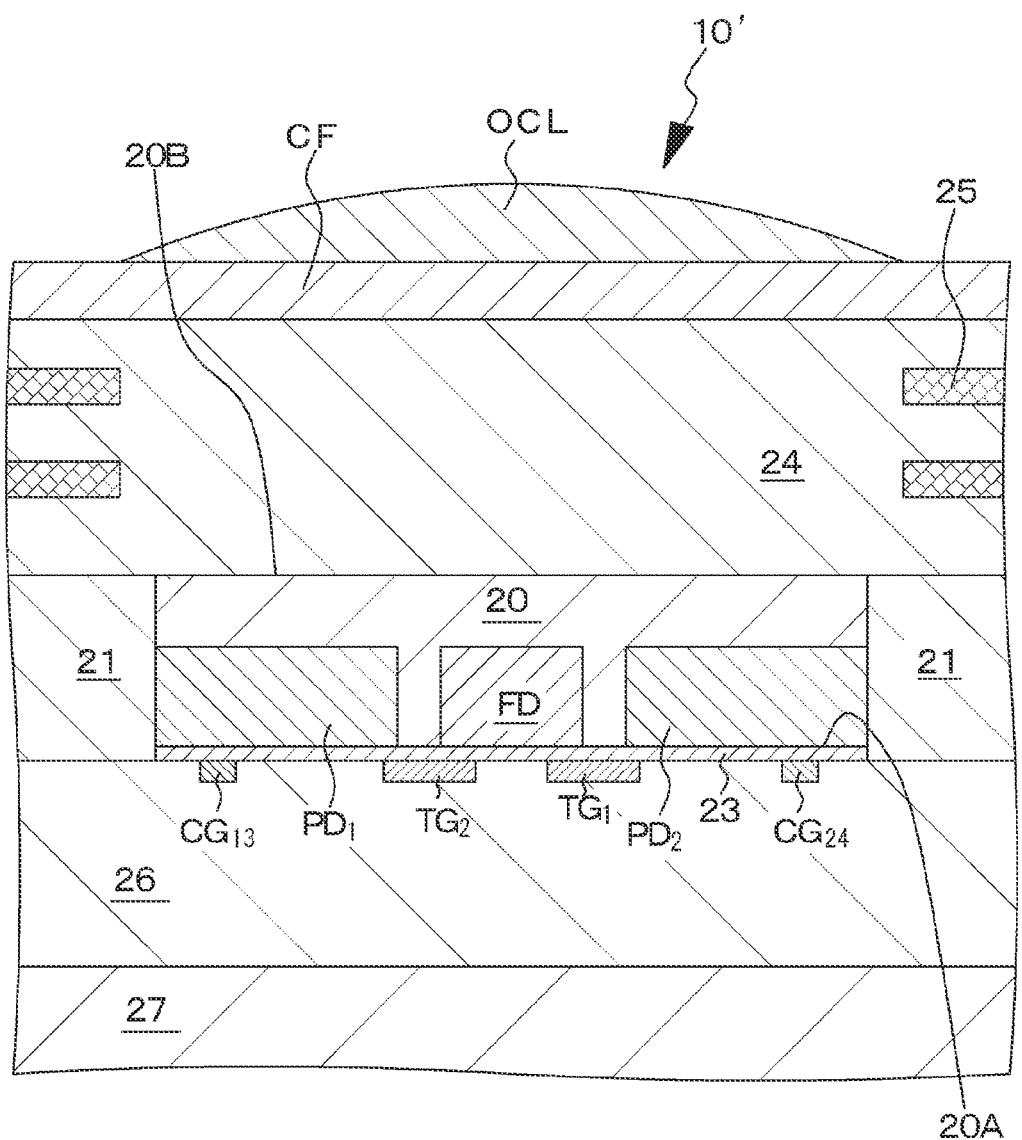
FIG. 9 is a schematic partial cross-sectional view of an imaging element (back irradiation type imaging element) of Example 3.

Example 3 is a modification of Examples 1 and 2. In Examples 1 and 2, the imaging device and the imaging element 10 are a front irradiation type imaging device and imaging element. Meanwhile, in Example 3, as FIG. 9 illustrates a schematic partial cross-sectional view of an imaging element, an imaging device and an imaging element 10' are a back irradiation type imaging device and imaging element.

Such a back irradiation type imaging element can be manufactured, for example, by the following method. That is, first, an SOI substrate is prepared. Then, the photoelectric conversion region PD, the boundary region 22, and the floating diffusion layer FD are formed in a silicon layer (corresponding to the base 20) located on a front surface side of the SOI substrate. Furthermore, various transistors and the like (not illustrated) constituting a control circuit and a drive circuit of an imaging element are formed on the base 20. Subsequently, the insulating film 23 is formed on a surface (front surface) 20A of the silicon layer (base 20), and the transfer control electrode TG and the charge transfer control electrode CG are formed on the insulating film 23. Then, various wires and an insulating layer 26 are further formed thereon, and then the insulating layer 26 and a support substrate 27 are bonded to each other. Thereafter, the SOI substrate is removed to expose a back surface 20B of the silicon layer (base 20). Then, the interlayer insulating layer 24 is formed on the back surface 20B of the base 20, and the wiring layer 25 is formed on the interlayer insulating layer 24. Then, the color filter layer CF is formed on the interlayer insulating layer 24, and an on-chip microlens (OCL) is disposed on the color filter layer CF. In this way, the back irradiation type imaging element of Example 3 can be obtained.

The configurations and structures of the imaging device and the imaging element 10' of Example 3 can be similar to those of the imaging device and the imaging element 10 of Examples 1 and 2 except for the above points, and therefore detailed description thereof will be omitted.

Hitherto, the present disclosure has been described on the basis of preferable Examples. However, the present disclosure is not limited to these Examples. The configurations and structures of the imaging element and the imaging device are illustrative and can be changed appropriately.

Figure 10A:
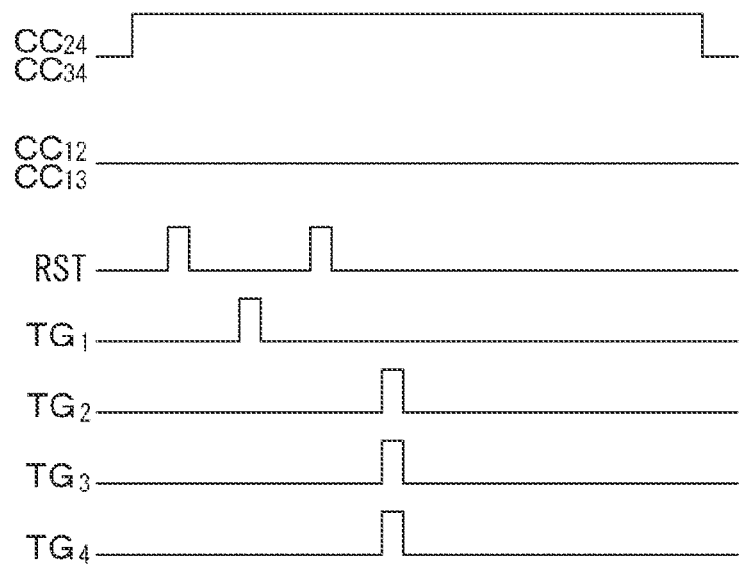
FIGS. 10A and 10B are a diagram schematically illustrating operations of a transfer control electrode and a charge transfer control electrode of a modification of the imaging element of Example 1, and a diagram schematically illustrating an obtained image signal, respectively.
Figure 10B:
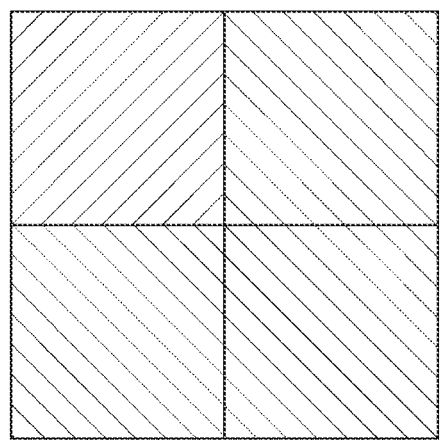

FIGS. 10A and 10B schematically illustrate operations of a transfer control electrode and a charge transfer control electrode of a modification of the imaging element of Example 1, and an obtained image signal, respectively. For example, in imaging in the first mode, it is also possible to adopt a configuration in which focus detection based on a phase difference is performed by the first photoelectric conversion region $PD_1$ and the second photoelectric conversion region $PD_2$, and an image signal added by the second photoelectric conversion region $PD_2$, the third photoelectric conversion region $PD_3$, and the fourth photoelectric conversion region $PD_4$ (or an image signal added by the third photoelectric conversion region $PD_3$ and the fourth photoelectric conversion region $PD_4$) is obtained. Note that, in imaging in the second mode, it is only required to adopt a configuration in which focus detection based on a phase difference is performed by the first photoelectric conversion region $PD_1$ and the third photoelectric conversion region $PD_3$, and an image signal added by the second photoelectric conversion region $PD_2$, the third photoelectric conversion region $PD_3$, and the fourth photoelectric conversion region $PD_4$ (or an image signal added by the second photoelectric conversion region $PD_2$ and the fourth photoelectric conversion region $PD_4$) is obtained.

Furthermore, an operating voltage of the (M−1)×N first charge transfer control electrodes CG can be different from an operating voltage of the (N−1)×M second transfer control electrodes CG, and this can optimize charge transfer between the photoelectric conversion regions.

Figure 11:
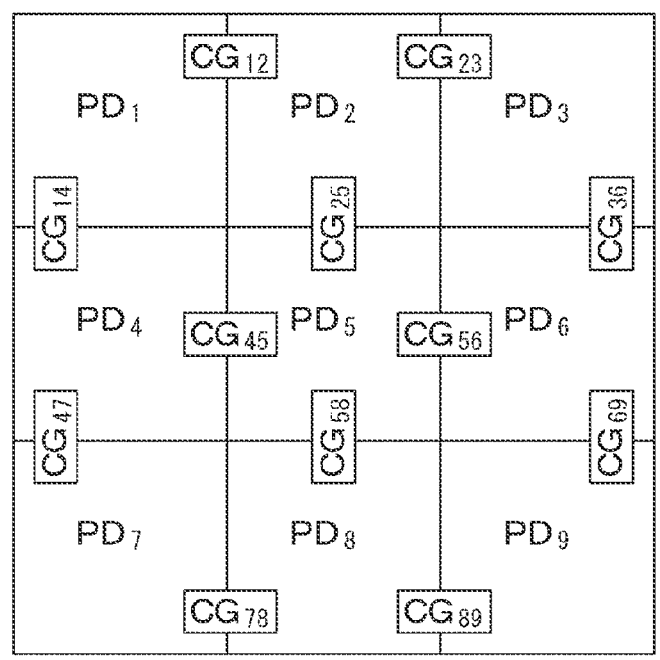
FIG. 11 is a diagram schematically illustrating arrangement of a photoelectric conversion region and a charge transfer control electrode in an imaging element having M×N=3×3 photoelectric conversion regions.
Figure 12A:
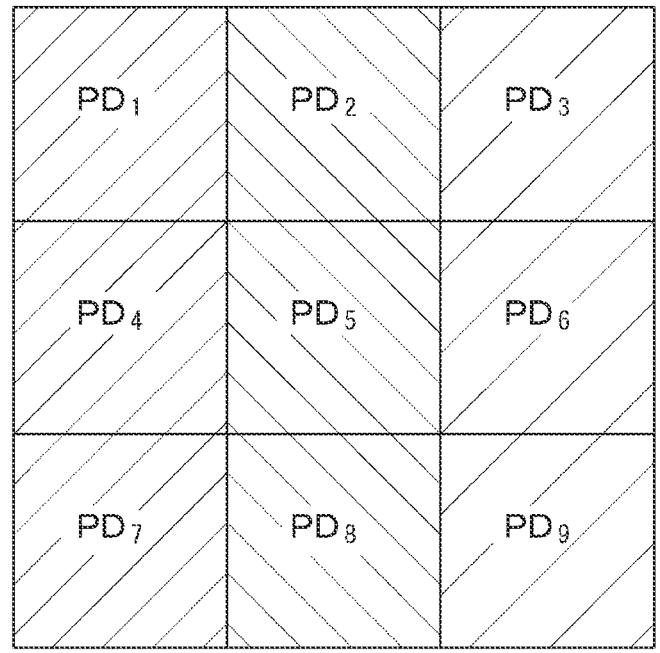
FIGS. 12A and 12B are a diagram schematically illustrating an image signal obtained in a case where an imaging device including an imaging element having M×N=3×3 photoelectric conversion regions is at a lateral position, and a diagram schematically illustrating an image signal obtained in a case where the imaging device including the imaging element having M×N=3×3 photoelectric conversion regions is at a longitudinal position, respectively.
Figure 12B:
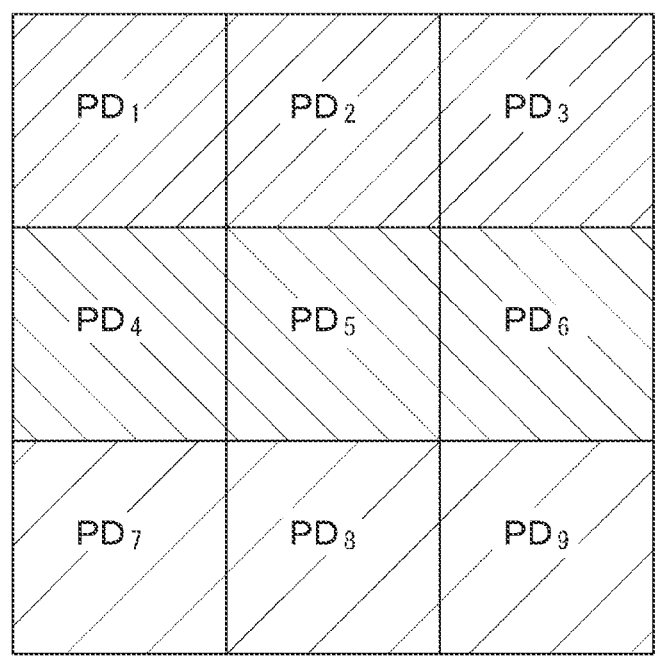

FIG. 11 schematically illustrates arrangement of the photoelectric conversion region PD and the charge transfer control electrode CG in the imaging element having M×N=3×3 photoelectric conversion regions in Example 1. Furthermore, FIGS. 12A and 12B schematically illustrate an image signal obtained in a case where an imaging device including this imaging element is at a lateral position, and an image signal obtained in a case where the imaging device including this imaging element is at a longitudinal position, respectively. In a case where the imaging device is at the lateral position or the longitudinal position, three image signals can be obtained. Then, for example, it is only required to perform focus detection on the basis of two image signals having the largest phase difference among the three image signals.

FIG. 13A schematically illustrates arrangement of the photoelectric conversion regions PD in the imaging element having M×N=8×8 photoelectric conversion regions in Example 1. Furthermore, FIG. 13B illustrates an example of division of an image signal in an imaging device including this imaging element. Note that, in FIG. 13A, the first charge transfer control electrode CG is disposed between a photoelectric conversion region $PD_{(m, n)}$ and a photoelectric conversion region $PD_{(m, n+1)}$, and the second charge transfer control electrode CG is disposed between the photoelectric conversion region $PD_{(m, n)}$ and a photoelectric conversion region $PD_{(m+1, n)}$, but these charge transfer control electrodes CG are not illustrated. Furthermore, in FIG. 13B, alphabets A, B, C, D, E, F, G, and H indicate groups of divided image signals.

Figure 17:
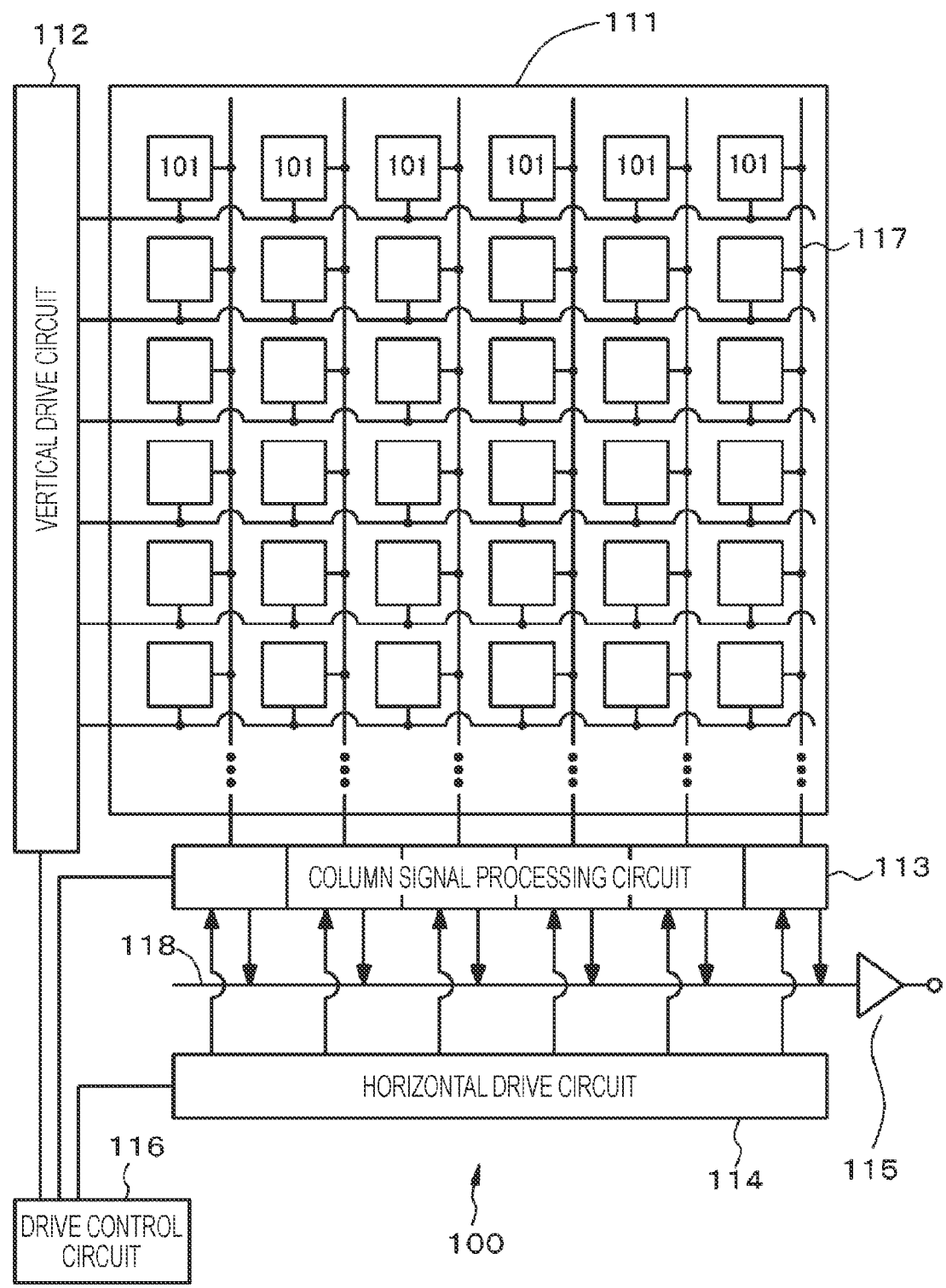
FIG. 17 is a conceptual diagram of an imaging device of Examples 1 to 3.

FIG. 17 illustrates a conceptual diagram of the imaging device of Examples 1 to 3. An imaging device 100 of Examples 1 to 3 includes an imaging region 111 in which imaging elements 101 are arrayed two-dimensionally, and a vertical drive circuit 112, a column signal processing circuit 113, a horizontal drive circuit 114, an output circuit 115, a drive control circuit 116, and the like as drive circuits (peripheral circuits) of the imaging elements 101. It goes without saying that these circuits can be constituted by known circuits, and also can be constituted using other circuit configurations (for example, various circuits used in a conventional CCD imaging device or CMOS imaging device). In FIG. 17, the reference number "101" of the imaging element 101 is displayed only in one row.

The drive control circuit 116 generates a clock signal or a control signal as a reference of operations of the vertical drive circuit 112, the column signal processing circuit 113, and the horizontal drive circuit 114 on the basis of a vertical synchronizing signal, a horizontal synchronizing signal, and a master clock. Then, the generated clock signal or control signal is input to the vertical drive circuit 112, the column signal processing circuit 113, and the horizontal drive circuit 114.

For example, the vertical drive circuit 112 is constituted by a shift register, and sequentially selects and scans the imaging elements 101 in the imaging region 111 in a row unit in a vertical direction. Then, a pixel signal (image signal) based on a current (signal) generated according to the amount of light received by each of the imaging elements 101 is sent to the column signal processing circuit 113 via a signal line (data output line) 117, VSL.

For example, the column signal processing circuit 113 is disposed for each column of the imaging elements 101. Image signals output from the imaging elements 101 in one row are subjected to signal processing such as noise removal or signal amplification with a signal from a black reference pixel (not illustrated, but formed around an effective pixel region) for each of the imaging elements. In an output stage of the column signal processing circuit 113, a horizontal selection switch (not illustrated) is connected and disposed between the column signal processing circuit 113 and a horizontal signal line 118.

For example, the horizontal drive circuit 114 is constituted by a shift register. By sequentially outputting a horizontal scanning pulse, the horizontal drive circuit 114 sequentially selects each of the column signal processing circuits 113, and outputs a signal from each of the column signal processing circuits 113 to the horizontal signal line 118.

The output circuit 115 performs signal processing to a signal sequentially supplied from each of the column signal processing circuits 113 via the horizontal signal line 118, and outputs the signal.

Figure 18:
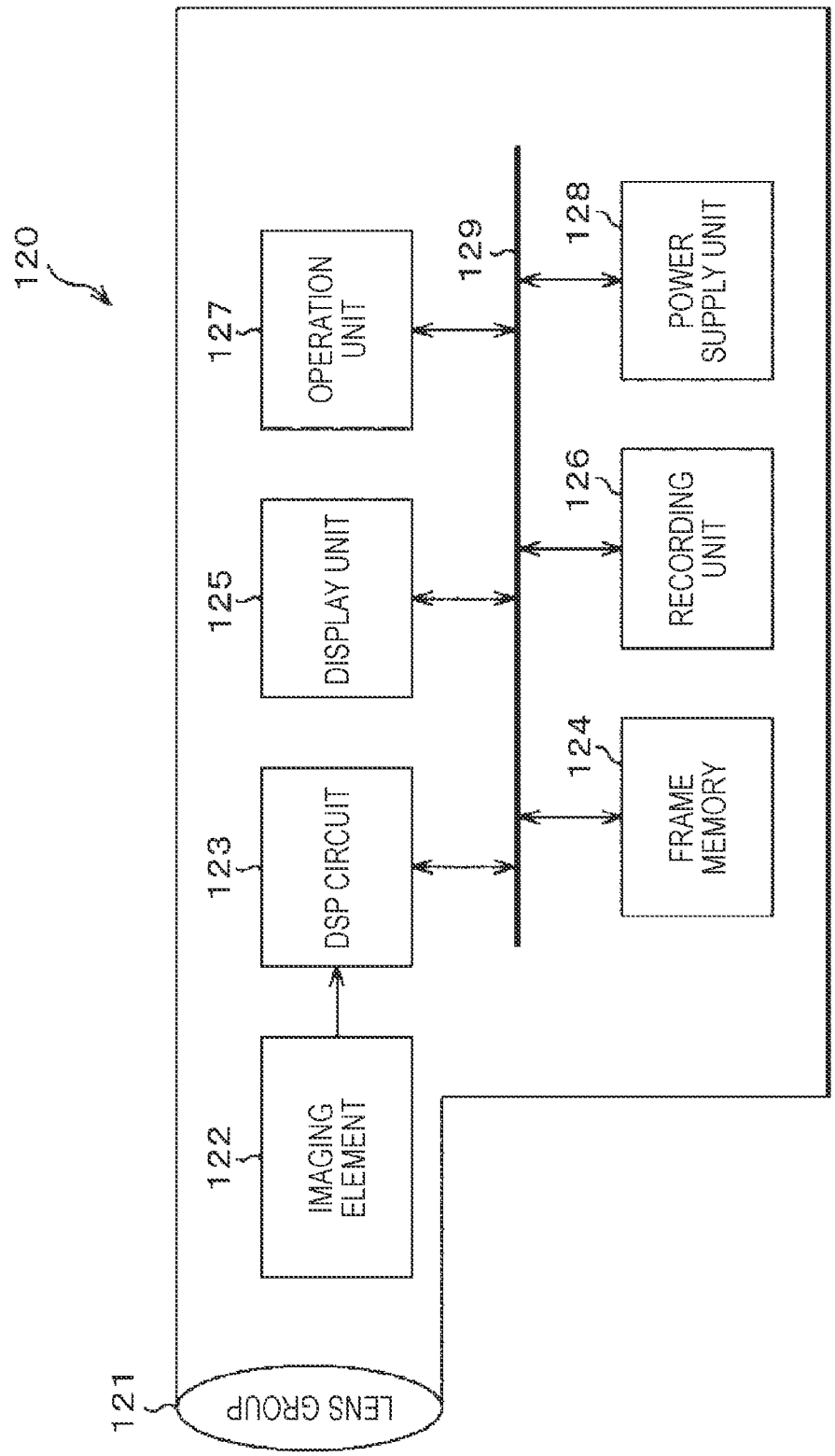
FIG. 18 is a block diagram illustrating a configuration example of the imaging device of Examples 1 to 3 when the imaging device is applied to an electronic device.

FIG. 18 is a block diagram illustrating a configuration example of the imaging device of Examples 1 to 3. Here, an imaging device 120 is a video camera, a digital still camera, or the like. The imaging device 120 includes a lens group 121, an imaging element 122, a digital signal processor (DSP) circuit 123, a frame memory 124, a display unit 125, a recording unit 126, an operation unit 127, and a power supply unit 128. The DSP circuit 123, the frame memory 124, the display unit 125, the recording unit 126, the operation unit 127, and the power supply unit 128 are connected to one another via a bus line 129.

The lens group 121 captures incident light (image light) from a subject to form an image on an imaging surface of the imaging element 122. The imaging element 122 is constituted by the above-described various imaging elements. The imaging element 122 converts the amount of incident light an image of which has been formed on the imaging surface by the lens group 121 into an electrical signal in a pixel unit, and outputs the electrical signal as a pixel signal to the DSP circuit 123. The DSP circuit 123 performs predetermined image processing on the pixel signal supplied from the imaging element 122, supplies the pixel signal after the image processing to the frame memory 124 in a frame unit, and causes the frame memory 124 to temporarily store the pixel signal.

The display unit 125 is constituted by, for example, a panel type display device such as a liquid crystal panel or an organic electro luminescence (EL) panel, and displays an image on the basis of the pixel signal in a frame unit temporarily stored in the frame memory 124. The recording unit 126 is constituted by a digital versatile disk (DVD), a flash memory, or the like, and reads and records the pixel signal in a frame unit temporarily stored in the frame memory 124. The operation unit 127 gives an operation command regarding various functions of the imaging device 120 under an operation of a user. The power supply unit 128 appropriately supplies power to the DSP circuit 123, the frame memory 124, the display unit 125, the recording unit 126, and the operation unit 127.

The electronic device only needs to include the imaging device described above in an image capturing unit (photoelectric conversion unit). Examples of the electronic device include, in addition to the imaging device 120, a mobile terminal device having an imaging function and a copier including the imaging device 120 in the image capturing unit (image reading unit).

Figure 19:
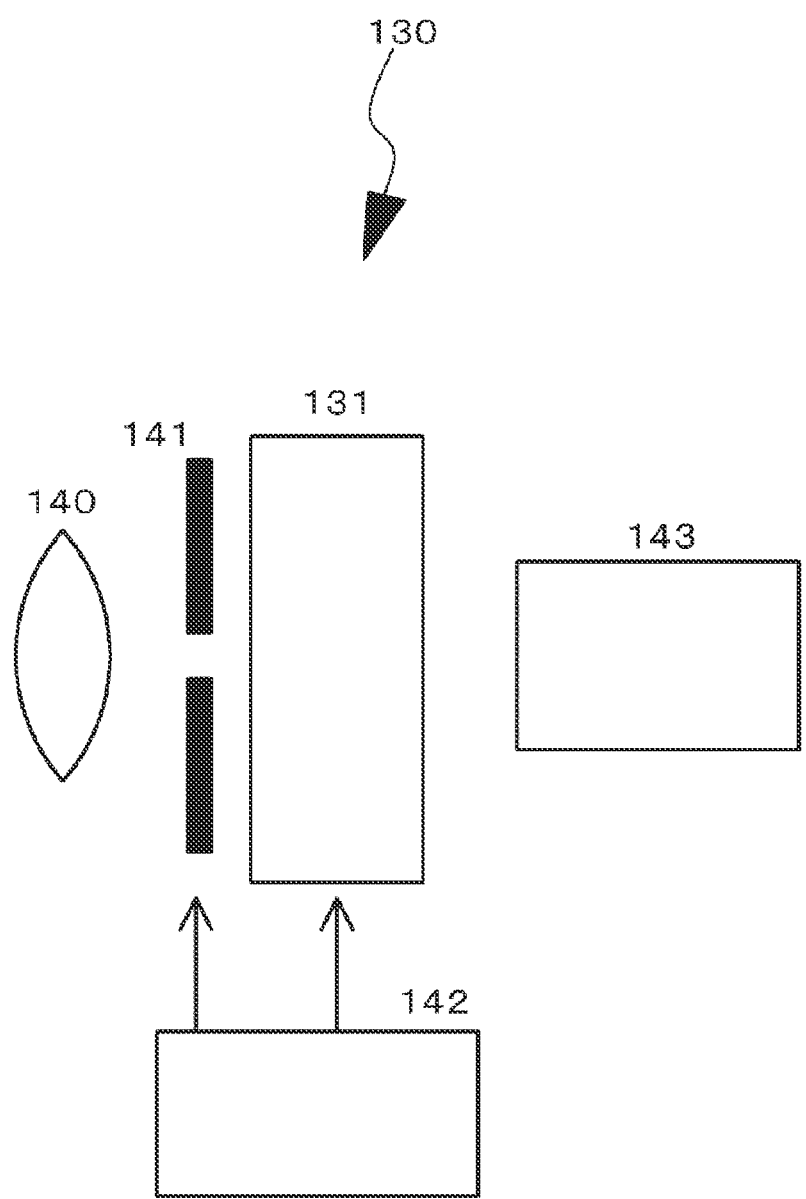
FIG. 19 is a conceptual diagram of an example in which an imaging device of the present disclosure is used for an electronic device (camera).

Furthermore, FIG. 19 illustrates an example in which a solid-state imaging device 131 including the imaging element of the present disclosure is used for an electronic device (camera) 130 as a conceptual diagram. The electronic device 130 includes the solid-state imaging device 131, an optical lens 140, a shutter device 141, a drive circuit 142, and a signal processing circuit 143. The optical lens 140 forms an image of image light (incident light) from a subject on an imaging surface of the solid-state imaging device 131. As a result, signal charges are accumulated in the solid-state imaging device 131 for a certain period of time. The shutter device 141 controls a light irradiation period and a light shielding period for the solid-state imaging device 131. The drive circuit 142 supplies a driving signal for controlling a transfer operation and the like of the solid-state imaging device 131 and a shutter operation of the shutter device 141. The solid-state imaging device 131 transfers a signal by a driving signal (timing signal) supplied from the drive circuit 142. The signal processing circuit 143 performs various signal processes. A video signal that has been subjected to signal processing is stored in a storage medium such as a memory or is output to a monitor. In such an electronic device 130, the pixel size in the solid-state imaging device 131 can be reduced and transfer efficiency can be improved, and therefore the electronic device 130 with improved pixel characteristics can be obtained. The electronic device 130 to which the solid-state imaging device 131 can be applied is not limited to a camera, and can be applied to an imaging device such as a digital still camera or a camera module for a mobile device such as a mobile phone.

The technology according to the present disclosure (the present technology) can be applied to various products. For example, the technology according to the present disclosure may be implemented as an apparatus mounted on any type of mobile body such as an automobile, an electric vehicle, a hybrid electric vehicle, a motorcycle, a bicycle, a personal mobility, an airplane, a drone, a ship, or a robot.

Figure 20:
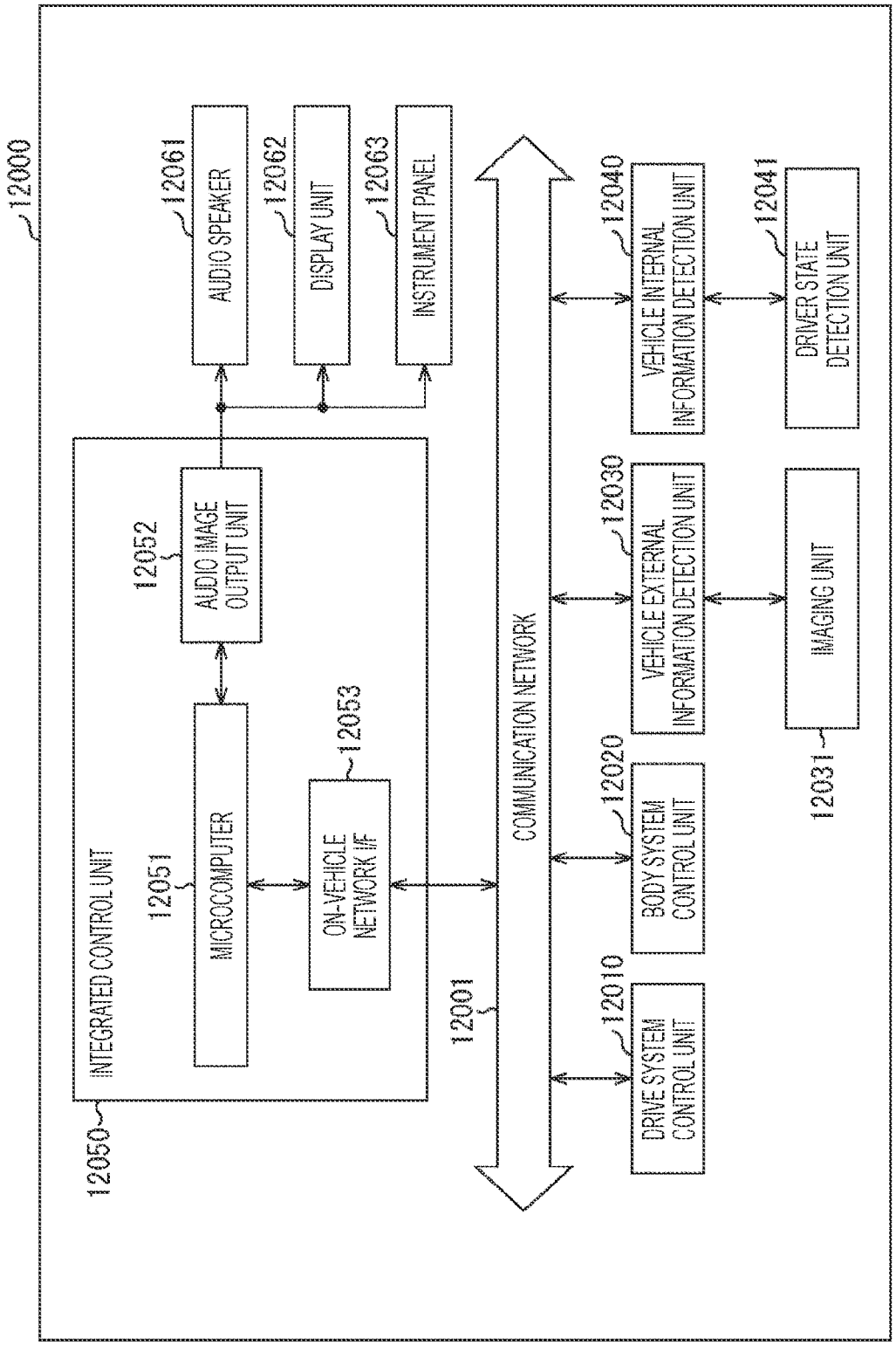
FIG. 20 is a block diagram illustrating an example of a schematic configuration of a vehicle control system.

FIG. 20 is a block diagram illustrating a schematic configuration example of a vehicle control system which is an example of a mobile body control system to which the technology according to the present disclosure can be applied.

A vehicle control system 12000 includes a plurality of electronic control units connected to one another via a communication network 12001. In the example illustrated in FIG. 20, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio image output unit 12052, and an on-vehicle network interface (I/F) 12053 are illustrated.

The drive system control unit 12010 controls an operation of a device related to a drive system of a vehicle according to various programs. For example, the drive system control unit 12010 functions as a control device of a driving force generating device for generating a driving force of a vehicle such as an internal combustion engine or a driving motor, a driving force transmitting mechanism for transmitting a driving force to wheels, a steering mechanism for adjusting a rudder angle of a vehicle, a braking device for generating a braking force of a vehicle, or the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, to the body system control unit 12020, a radio wave transmitted from a portable device substituted for a key or signals of various switches can be input. The body system control unit 12020 receives input of the radio wave or signals and controls a door lock device, a power window device, a lamp, and the like of a vehicle.

The vehicle external information detection unit 12030 detects information outside a vehicle on which the vehicle control system 12000 is mounted. For example, to the vehicle external information detection unit 12030, an imaging unit 12031 is connected. The vehicle external information detection unit 12030 causes the imaging unit 12031 to image an image outside a vehicle and receives an imaged image. The vehicle external information detection unit 12030 may perform object detection processing or distance detection processing of a person, a car, an obstacle, a sign, a character on a road surface, or the like on the basis of the received image.

The imaging unit 12031 is a light sensor for receiving light and outputting an electric signal corresponding to the amount of light received. The imaging unit 12031 can output an electric signal as an image or output the electric signal as distance measurement information. Furthermore, the light received by the imaging unit 12031 may be visible light or invisible light such as infrared light.

The vehicle internal information detection unit 12040 detects information inside a vehicle. To the vehicle internal information detection unit 12040, for example, a driver state detection unit 12041 for detecting the state of a driver is connected. The driver state detection unit 12041 includes, for example, a camera for imaging a driver. The vehicle internal information detection unit 12040 may calculate the degree of fatigue or the degree of concentration of a driver or may determine whether or not the driver is dozing off on the basis of detection information input from the driver state detection unit 12041.

The microcomputer 12051 can calculate a control target value of a driving force generating device, a steering mechanism, or a braking device on the basis of information inside and outside a vehicle, acquired by the vehicle external information detection unit 12030 or the vehicle internal information detection unit 12040, and can output a control command to the drive system control unit 12010. For example, the microcomputer 12051 can perform cooperative control aiming at realizing a function of advanced driver assistance system (ADAS) including collision avoidance or impact mitigation of a vehicle, following travel based on inter-vehicle distance, vehicle speed maintenance travel, vehicle collision warning, vehicle lane departure warning, and the like.

Furthermore, the microcomputer 12051 can perform cooperative control aiming at, for example, automatic driving that autonomously travels without depending on driver's operation by controlling a driving force generating device, a steering mechanism, a braking device, or the like on the basis of information around a vehicle, acquired by the vehicle external information detection unit 12030 or the vehicle internal information detection unit 12040.

Furthermore, the microcomputer 12051 can output a control command to the body system control unit 12020 on the basis of vehicle external information acquired by the vehicle external information detection unit 12030. For example, the microcomputer 12051 can perform cooperative control aiming at antiglare such as switching from high beam to low beam by controlling a headlamp according to the position of a preceding vehicle or an oncoming vehicle detected by the vehicle external information detection unit 12030.

The audio image output unit 12052 transmits at least one of an audio output signal or an image output signal to an output device capable of visually or audibly notifying a passenger of a vehicle or the outside of the vehicle of information. In the example of FIG. 20, as the output device, an audio speaker 12061, a display unit 12062, and an instrument panel 12063 are illustrated. The display unit 12062 may include an on-board display and/or a head-up display, for example.

Figure 21:
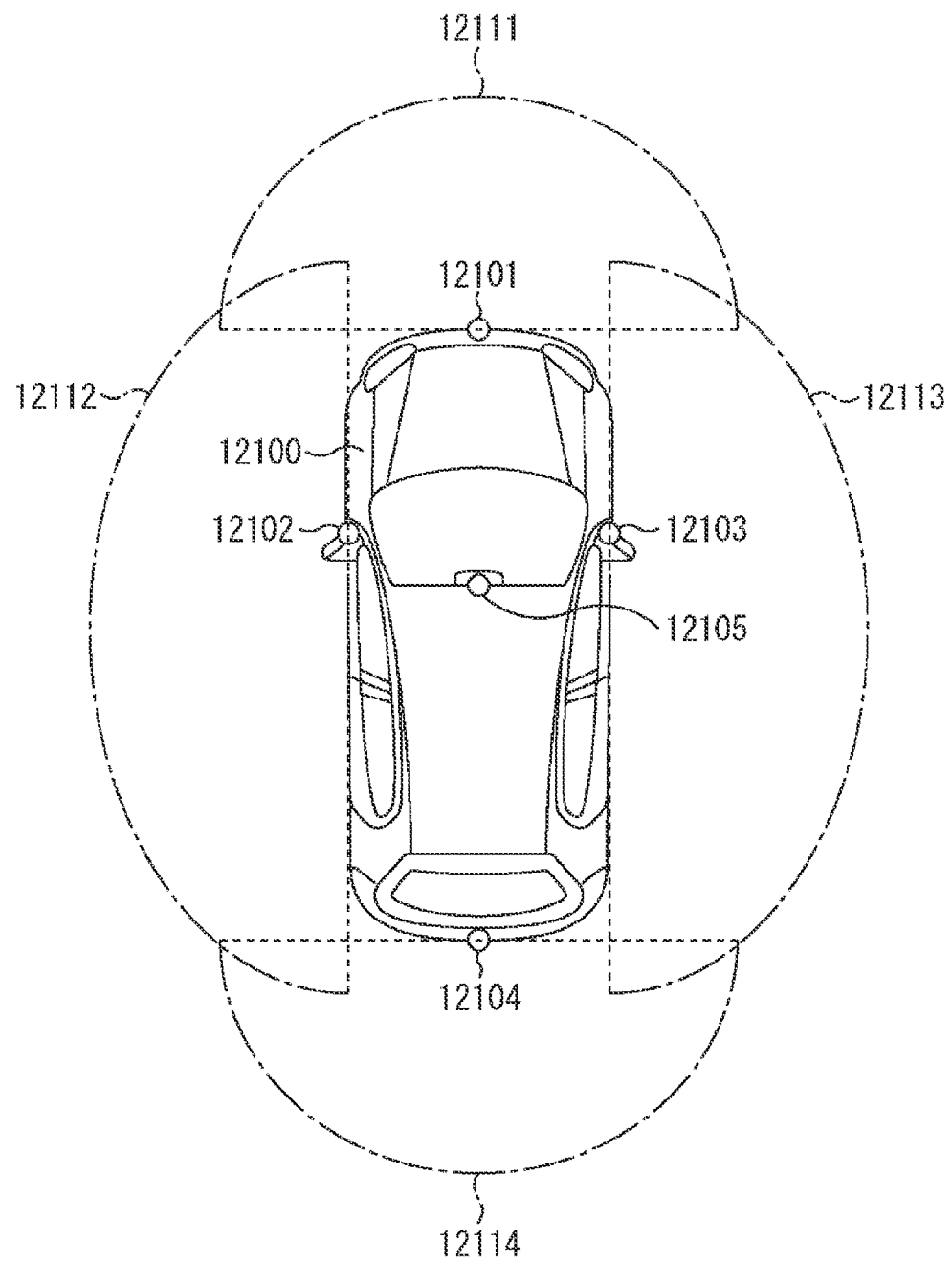
FIG. 21 is an explanatory diagram illustrating examples of installation positions of a vehicle external information detection unit and an imaging unit.

FIG. 21 is a diagram illustrating an example of an installation position of the imaging unit 12031.

In FIG. 21, the vehicle 12100 includes imaging units 12101, 12102, 12103, 12104, and 12105 as the imaging unit 12031.

The imaging units 12101, 12102, 12103, 12104, and 12105 are disposed, for example, in a front nose, a side mirror, a rear bumper, and a back door of the vehicle 12100, in an upper portion of a front glass in a passenger compartment, and the like. The imaging unit 12101 disposed in a front nose and the imaging unit 12105 disposed in an upper portion of a front glass in a passenger compartment mainly acquire images in front of the vehicle 12100. The imaging units 12102 and 12103 disposed in side mirrors mainly acquire images on sides of the vehicle 12100. The imaging unit 12104 disposed in a rear bumper or a back door mainly acquires an image behind the vehicle 12100. The front images acquired by the imaging units 12101 and 12105 are mainly used for detecting a preceding vehicle, a pedestrian, an obstacle, a traffic signal, a traffic sign, a lane, or the like.

Note that FIG. 21 illustrates examples of imaging ranges of the imaging units 12101 to 12104. An imaging range 12111 indicates an imaging range of the imaging unit 12101 disposed in a front nose. Imaging ranges 12112 and 12113 indicate imaging ranges of the imaging units 12102 and 12103 disposed in side mirrors, respectively. An imaging range 12114 indicates an imaging range of the imaging unit 12104 disposed in a rear bumper or a back door. For example, by superimposing image data imaged by the imaging units 12101 to 12104 on one another, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 determines a distance to each three-dimensional object in the imaging range 12111 to 12114 and a temporal change (relative speed with respect to the vehicle 12100) of the distance on the basis of the distance information obtained from the imaging units 12101 to 12104, and can thereby particularly extract a three-dimensional object which is the nearest three-dimensional object on a traveling path of the vehicle 12100 and is traveling at a predetermined speed (for example, 0 km/h or more) in substantially the same direction as the vehicle 12100 as a preceding vehicle. Moreover, the microcomputer 12051 can set an inter-vehicle distance to be secured in advance in front of the preceding vehicle, and can perform automatic brake control (including following stop control), automatic acceleration control (including following start control), and the like. In this way, it is possible to perform cooperative control aiming at, for example, automatic driving that autonomously travels without depending on driver's operation.

For example, the microcomputer 12051 classifies three-dimensional object data related to a three-dimensional object into a two-wheeled vehicle, a regular vehicle, a large vehicle, a pedestrian, and another three-dimensional object such as a telegraph pole on the basis of the distance information obtained from the imaging units 12101 to 12104 and extracts data, and can use the extracted data for automatic avoidance of an obstacle. For example, the microcomputer 12051 identifies an obstacle around the vehicle 12100 as an obstacle that a driver of the vehicle 12100 can see and an obstacle that is difficult to see. Then, the microcomputer 12051 judges a collision risk indicating a risk of collision with each obstacle. When the collision risk is higher than a set value and there is a possibility of collision, the microcomputer 12051 can perform driving assistance for avoiding collision by outputting an alarm to a driver via the audio speaker 12061 or the display unit 12062, or performing forced deceleration or avoiding steering via the drive system control unit 12010.

At least one of the imaging units 12101 to 12104 may be an infrared camera for detecting an infrared ray. For example, the microcomputer 12051 can recognize a pedestrian by determining whether or not a pedestrian exists in imaged images of the imaging units 12101 to 12104. Such recognition of a pedestrian is performed by, for example, a procedure of extracting characteristic points in imaged images of the imaging units 12101 to 12104 as infrared cameras and a procedure of performing pattern matching processing on a series of characteristic points indicating an outline of an object and determining whether or not a pedestrian exists. If the microcomputer 12051 determines that a pedestrian exists in imaged images of the imaging units 12101 to 12104 and recognizes a pedestrian, the audio image output unit 12052 controls the display unit 12062 such that the display unit 12062 superimposes and displays a rectangular contour line for emphasis on the recognized pedestrian. Furthermore, the audio image output unit 12052 may control the display unit 12062 such that the display unit 12062 displays an icon or the like indicating a pedestrian at a desired position.

Furthermore, for example, the technology according to the present disclosure may be applied to an endoscopic surgical system.

Figure 22:
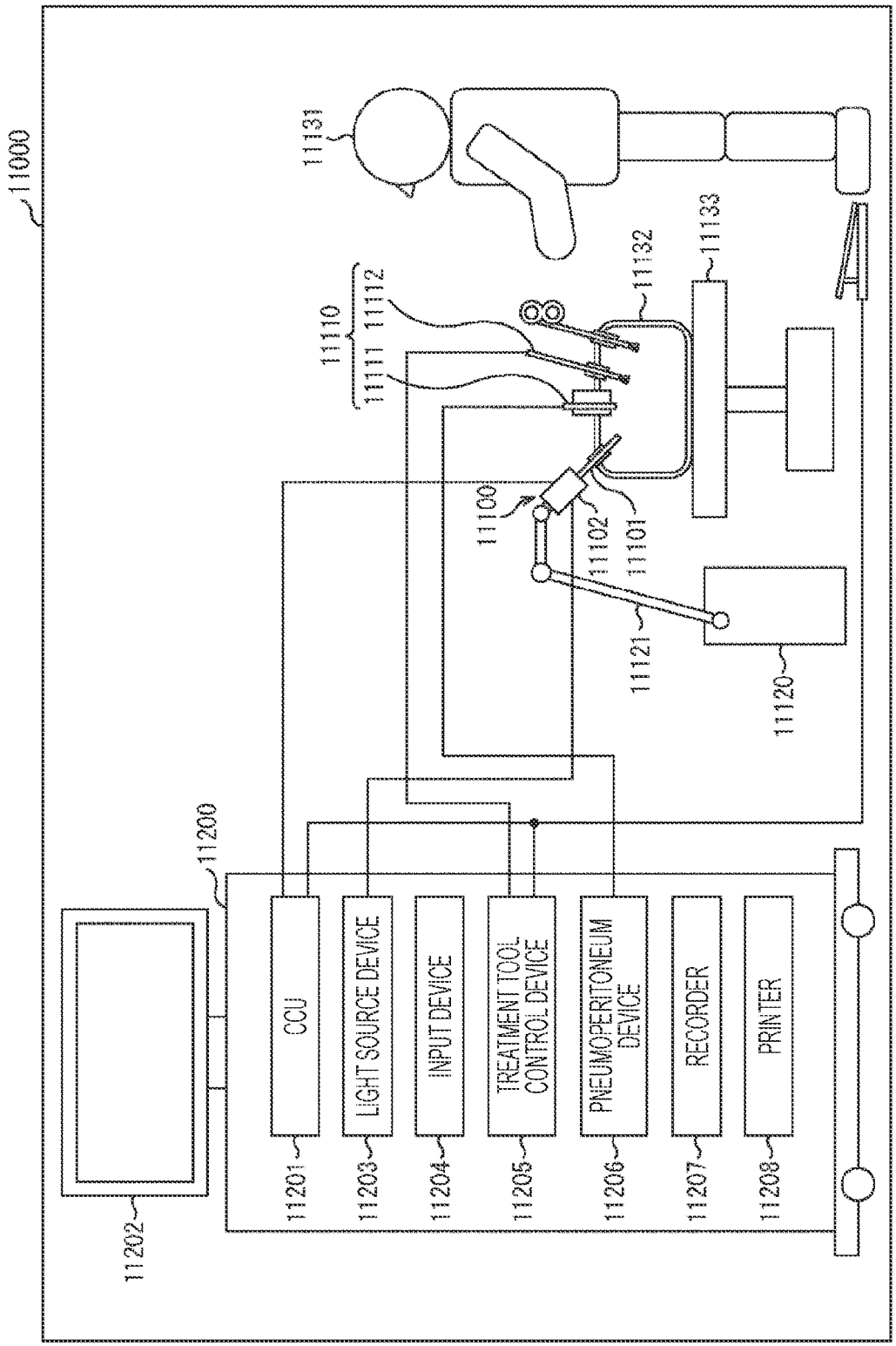
FIG. 22 is a diagram illustrating an example of a schematic configuration of an endoscopic surgical system.

FIG. 22 is a diagram illustrating an example of a schematic configuration of an endoscopic surgical system to which the technology according to the present disclosure (the present technology) can be applied.

FIG. 22 illustrates a situation in which a surgeon (physician) 11131 is performing surgery on a patient 11132 on a patient bed 11133 using an endoscopic surgical system 11000. As illustrated in the drawing, the endoscopic surgical system 11000 includes an endoscope 11100, another surgical tool 11110 such as a pneumoperitoneum tube 11111 or an energy treatment tool 11112, a support arm device 11120 for supporting the endoscope 11100, and a cart 11200 on which various devices for endoscopic surgery are mounted.

The endoscope 11100 includes a lens barrel 11101 to be inserted into a body cavity of the patient 11132 in a region of a predetermined length from a tip thereof, and a camera head 11102 connected to a proximal end of the lens barrel 11101. In the illustrated example, the endoscope 11100 configured as a so-called rigid mirror including the rigid lens barrel 11101 is illustrated, but the endoscope 11100 may be configured as a so-called flexible mirror including a flexible lens barrel.

At the tip of the lens barrel 11101, an opening into which an objective lens is fitted is disposed. A light source device 11203 is connected to the endoscope 11100. Light generated by the light source device 11203 is guided to the tip of the lens barrel by a light guide extended inside the lens barrel 11101, and is emitted toward an observation target in a body cavity of the patient 11132 via the objective lens. Note that the endoscope 11100 may be a forward-viewing endoscope, an oblique-viewing endoscope, or a side-viewing endoscope.

An optical system and an imaging element are disposed inside the camera head 11102. Reflected light (observation light) from an observation target is converged on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), and the like, and integrally controls operations of the endoscope 11100 and the display device 11202. Moreover, the CCU 11201 receives an image signal from the camera head 11102, and performs, on the image signal, various image processing for displaying an image based on the image signal, such as development processing (demosaic processing), for example.

The display device 11202 displays an image based on an image signal subjected to image processing by the CCU 11201 under the control of the CCU 11201.

The light source device 11203 includes a light source such as a light emitting diode (LED), for example, and supplies irradiation light for imaging a surgical site or the like to the endoscope 11100.

An input device 11204 is an input interface to the endoscopic surgical system 11000. A user can input various kinds of information and instructions to the endoscopic surgical system 11000 via the input device 11204. For example, the user inputs an instruction or the like to change imaging conditions (type of irradiation light, magnification, focal length, and the like) by the endoscope 11100.

A treatment tool control device 11205 controls driving of the energy treatment tool 11112 for cauterizing and cutting a tissue, sealing a blood vessel, or the like. A pneumoperitoneum device 11206 feeds a gas into a body cavity via the pneumoperitoneum tube 11111 in order to inflate the body cavity of the patient 11132 for the purpose of securing a field of view by the endoscope 11100 and securing a working space of a surgeon. A recorder 11207 is a device capable of recording various kinds of information regarding surgery. A printer 11208 is a device capable of printing various kinds of information regarding surgery in various formats such as a text, an image, and a graph.

Note that the light source device 11203 for supplying irradiation light used for imaging a surgical site to the endoscope 11100 may include an LED, a laser light source, or a white light source constituted by a combination thereof, for example. In a case where the white light source is constituted by a combination of RGB laser light sources, the output intensity and the output timing of each color (each wavelength) can be controlled with high precision, and therefore adjustment of a white balance of an imaged image can be performed by the light source device 11203. Furthermore, in this case, by irradiating an observation target with laser light from each of the RGB laser light sources in a time division manner and controlling driving of an imaging element of the camera head 11102 in synchronization with the irradiation timing, it is also possible to image an image corresponding to each of RGB in a time division manner. According to this method, a color image can be obtained without disposing a color filter layer in the imaging element.

Furthermore, driving of the light source device 11203 may be controlled so as to change the intensity of light output at predetermined time intervals. By controlling driving of the imaging element of the camera head 11102 in synchronization with the timing of the change of the intensity of the light to acquire an image in a time division manner and synthesizing the image, a high dynamic range image without so-called blocked up shadows or blown out highlights can be generated.

Furthermore, the light source device 11203 may be configured so as to be able to supply light in a predetermined wavelength band corresponding to special light observation. In the special light observation, for example, by irradiation with light in a narrower band than irradiation light (in other words, white light) at the time of ordinary observation using wavelength dependency of light absorption in a body tissue, a predetermined tissue such as a blood vessel of a mucosal surface layer is imaged at a high contrast, that is, so-called narrow band imaging is performed. Alternatively, in the special light observation, fluorescence observation for obtaining an image by fluorescence generated by irradiation with excitation light may be performed. In the fluorescence observation, it is possible to observe fluorescence from a body tissue (autofluorescence observation) by irradiating the body tissue with excitation light, or to obtain a fluorescent image by injecting a reagent such as indocyanine green (ICG) into a body tissue and irradiating the body tissue with excitation light corresponding to a fluorescence wavelength of the reagent, for example. The light source device 11203 can be configured so as to be able to supply narrow band light and/or excitation light corresponding to such special light observation.

Figure 23:
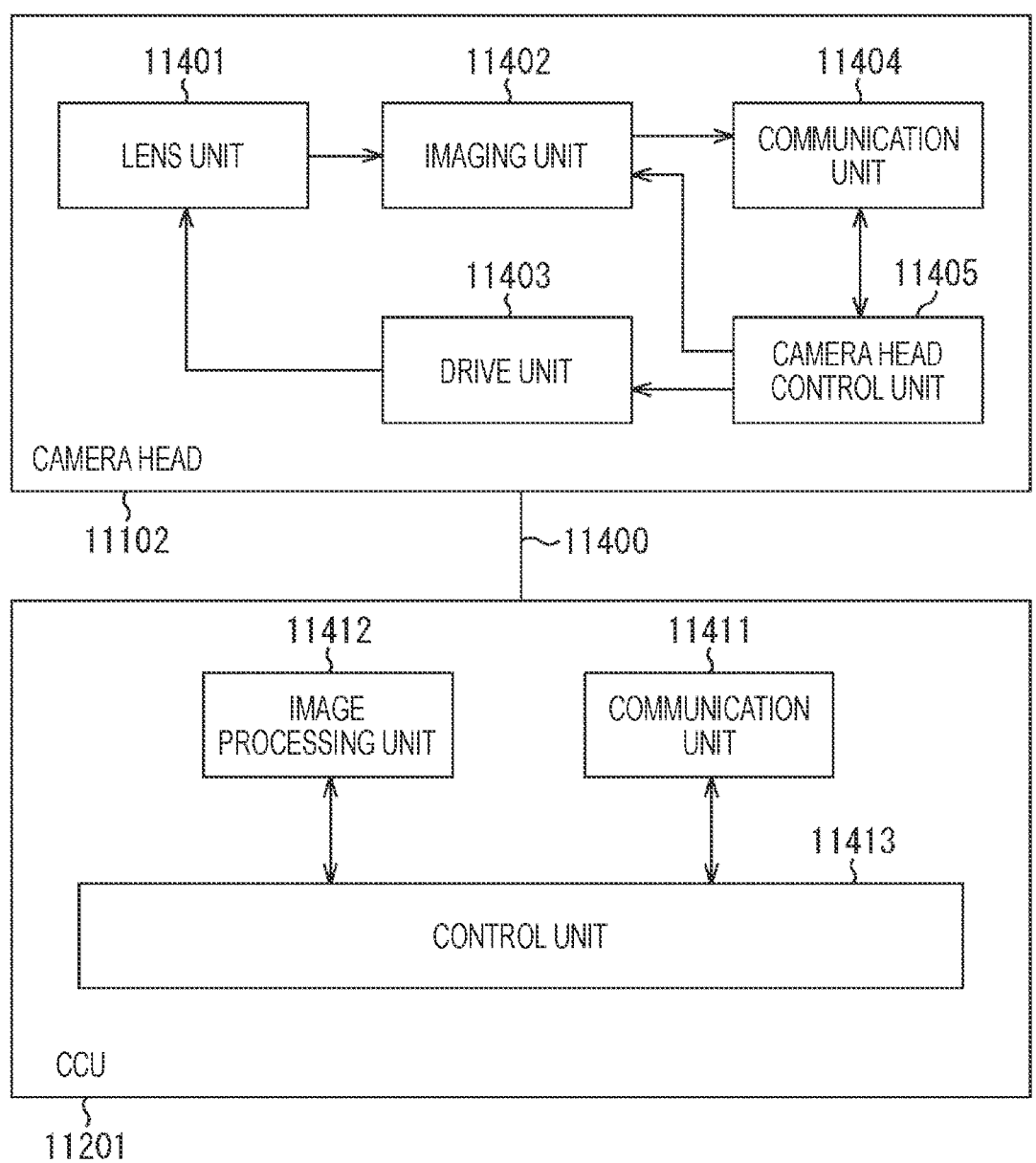
FIG. 23 is a block diagram illustrating examples of functional configurations of a camera head and a CCU.

FIG. 23 is a block diagram illustrating examples of functional configurations of the camera head 11102 and the CCU 11201 illustrated in FIG. 22.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system disposed at a connecting portion with the lens barrel 11101. Observation light taken in from a tip of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging unit 11402 may include one imaging element (so-called single plate type) or a plurality of imaging elements (so-called multiplate type). In a case where the imaging unit 11402 includes multiplate type imaging elements, for example, an image signal corresponding to each of RGB may be generated by each imaging element, and a color image may be obtained by synthesizing these image signals. Alternatively, the imaging unit 11402 may include a pair of imaging elements for acquiring an image signal for each of the right eye and the left eye corresponding to three-dimensional (3D) display. By performing the 3D display, the surgeon 11131 can grasp the depth of a living tissue in a surgical site more accurately. Note that in a case where the imaging unit 11402 includes multiplate type imaging elements, a plurality of lens units 11401 can be disposed corresponding to the respective imaging elements.

Furthermore, the imaging unit 11402 is not necessarily disposed in the camera head 11102. For example, the imaging unit 11402 may be disposed just behind an objective lens inside the lens barrel 11101.

The drive unit 11403 includes an actuator, and moves a zoom lens and a focus lens of the lens unit 11401 by a predetermined distance along an optical axis under control of the camera head control unit 11405. Therefore, the magnification and the focus of an image imaged by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal includes information regarding imaging conditions such as information indicating designation of a frame rate of an imaged image, information indicating designation of an exposure value at the time of imaging, and/or information indicating designation of the magnification and the focus of an imaged image, for example.

Note that the imaging conditions such as the above-described frame rate, exposure value, magnification, and focus may be appropriately designated by a user, or may be automatically set by the control unit 11413 of the CCU 11201 on the basis of an acquired image signal. In the latter case, the endoscope 11100 has a so-called auto exposure (AE) function, a so-called auto focus (AF) function, and a so-called auto white balance (AWB) function.

The camera head control unit 11405 controls driving of the camera head 11102 on the basis of a control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Furthermore, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal which is RAW data transmitted from the camera head 11102.

The control unit 11413 performs various kinds of control concerning imaging of a surgical site or the like by the endoscope 11100 and display of an imaged image obtained by imaging a surgical site or the like. For example, the control unit 11413 generates a control signal for controlling driving of the camera head 11102.

Furthermore, the control unit 11413 causes the display device 11202 to display an imaged image of a surgical site or the like on the basis of an image signal subjected to image processing by the image processing unit 11412. In this case, the control unit 11413 may recognize various objects in the imaged image using various image recognition techniques. For example, by detecting the shape, color, and the like of an edge of an object included in the imaged image, the control unit 11413 can recognize a surgical tool such as forceps, a specific living body part, bleeding, a mist at the time of using the energy treatment tool 11112, and the like. When the display device 11202 displays the imaged image, the control unit 11413 may cause the display device 11202 to superimpose and display various kinds of surgical support information on the image of the surgical site using the recognition result. The surgical support information is superimposed and displayed, and presented to the surgeon 11131. This makes it possible to reduce a burden on the surgeon 11131 and makes it possible for the surgeon 11131 to reliably perform surgery.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, communication is performed by wire using the transmission cable 11400, but communication between the camera head 11102 and the CCU 11201 may be performed wirelessly.

Note that the endoscopic surgical system has been described as an example here. However, the technology according to the present disclosure may also be applied to, for example, a microscopic surgery system or the like.

Note that the present disclosure can have the following configurations.

[A01]<<Imaging Device>>

An imaging device including a plurality of imaging elements, in which each of the imaging elements includes:

M×N photoelectric conversion regions arrayed such that M photoelectric conversion regions are arrayed in a first direction and N photoelectric conversion regions are arrayed in a second direction different from the first direction;

a floating diffusion layer shared by the M×N photoelectric conversion regions;

a transfer control electrode that is disposed corresponding to each of the photoelectric conversion regions and transfers charges generated in each of the photoelectric conversion regions to the floating diffusion layer;

(M−1)×N first charge transfer control electrodes that control charge transfer between the M photoelectric conversion regions arrayed in the first direction; and (N−1)×M second charge transfer control electrodes that control charge transfer between the N photoelectric conversion regions arrayed in the second direction, in the M photoelectric conversion regions arrayed in the first direction, an m-th first charge transfer control electrode [in which m is any integer of 1 to (M−1)] controls charge transfer between an m-th photoelectric conversion region and an (m+1)-th photoelectric conversion region, and in the N photoelectric conversion regions arrayed in the second direction, an n-th second charge transfer control electrode [in which n is any integer of 1 to (N−1)] controls charge transfer between an n-th photoelectric conversion region and an (n+1)-th photoelectric conversion region.

[A02] The imaging device according to [A01], in which

M=2 and N=2, and each of the imaging elements includes:

a first photoelectric conversion region and a second photoelectric conversion region juxtaposed in the first direction, a third photoelectric conversion region disposed adjacent to the first photoelectric conversion region in the second direction, and a fourth photoelectric conversion region disposed adjacent to the second photoelectric conversion region and the third photoelectric conversion region;

a floating diffusion layer shared by the first photoelectric conversion region, the second photoelectric conversion region, the third photoelectric conversion region, and the fourth photoelectric conversion region;

a first transfer control electrode that transfers charges generated in the first photoelectric conversion region to the floating diffusion layer;

a second transfer control electrode that transfers charges generated in the second photoelectric conversion region to the floating diffusion layer;

a third transfer control electrode that transfers charges generated in the third photoelectric conversion region to the floating diffusion layer;

a fourth transfer control electrode that transfers charges generated in the fourth photoelectric conversion region to the floating diffusion layer;

a first-A charge transfer control electrode that controls charge transfer between the first photoelectric conversion region and the second photoelectric conversion region;

a first-B charge transfer control electrode that controls charge transfer between the third photoelectric conversion region and the fourth photoelectric conversion region;

a second-A charge transfer control electrode that controls charge transfer between the first photoelectric conversion region and the third photoelectric conversion region; and a second-B charge transfer control electrode that controls charge transfer between the second photoelectric conversion region and the fourth photoelectric conversion region.

[A03] The imaging device according to [A01] or [A02], further including a control circuit, in which at the time of imaging, the control circuit controls operations of the first charge transfer control electrode and the second charge transfer control electrode in a first mode in which the first charge transfer control electrode is turned into an inoperative state when the second charge transfer control electrode is in an operative state, and in a second mode in which the second charge transfer control electrode is turned into an inoperative state when the first charge transfer control electrode is in an operative state.

[A04] The imaging device according to [A03], in which at the time of imaging, the control circuit further controls the operations of the first charge transfer control electrode and the second charge transfer control electrode in a third mode in which the first charge transfer control electrode and the second charge transfer control electrode are turned into an inoperative state.

[A05] The imaging device according to [A03] or [A04], in which the control circuit switches between the first mode and the second mode on the basis of posture information of the imaging device.

[A06] The imaging device according to [A05], in which the posture information of the imaging device is information indicating that the imaging device is located in a lateral direction and information indicating that the imaging device is located in a longitudinal direction.

[A07] The imaging device according to any one of [A01] to [A06], in which a maximum value of an impurity concentration in a boundary region located between the photoelectric conversion region and the photoelectric conversion region is lower than a maximum value of an impurity concentration in the photoelectric conversion region.

[A08] The imaging device according to any one of [A01] to [A06], in which a depth at which an impurity concentration in a boundary region located between the photoelectric conversion region and the photoelectric conversion region indicates a maximum value is shallower than a depth at which an impurity concentration in the photoelectric conversion region indicates a maximum value.

[A09] The imaging device according to any one of [A01] to [A08], in which a width of a boundary region located between the photoelectric conversion region and the photoelectric conversion region is narrower than a width of the photoelectric conversion region.

[A10] The imaging device according to any one of [A01] to [A09], in which an operating voltage of the (M−1)×N first charge transfer control electrodes is the same as an operating voltage of the (N−1)×M second charge transfer control electrodes.

[A11] The imaging device according to any one of [A01] to [A09], in which an operating voltage of the (M−1)×N first charge transfer control electrodes is different from an operating voltage of the (N−1)×M second charge transfer control electrodes.

[B01]<<Imaging Element>>

An imaging element including:

M×N photoelectric conversion regions arrayed such that M photoelectric conversion regions are arrayed in a first direction and N photoelectric conversion regions are arrayed in a second direction different from the first direction;

a floating diffusion layer shared by the M×N photoelectric conversion regions;

a transfer control electrode that is disposed corresponding to each of the photoelectric conversion regions and transfers charges generated in each of the photoelectric conversion regions to the floating diffusion layer;

(M−1)×N first charge transfer control electrodes that control charge transfer between the M photoelectric conversion regions arrayed in the first direction; and (N−1)×M second charge transfer control electrodes that control charge transfer between the N photoelectric conversion regions arrayed in the second direction, in which in the M photoelectric conversion regions arrayed in the first direction, an m-th first charge transfer control electrode [in which m is any integer of 1 to (M−1)] controls charge transfer between an m-th photoelectric conversion region and an (m+1)-th photoelectric conversion region, and in the N photoelectric conversion regions arrayed in the second direction, an n-th second charge transfer control electrode [in which n is any integer of 1 to (N−1)] controls charge transfer between an n-th photoelectric conversion region and an (n+1)-th photoelectric conversion region.

[B02] The imaging device according to [B01], in which a maximum value of an impurity concentration in a boundary region located between the photoelectric conversion region and the photoelectric conversion region is lower than a maximum value of an impurity concentration in the photoelectric conversion region.

[B03] The imaging device according to [B01] or [B02], in which a depth at which an impurity concentration in a boundary region located between the photoelectric conversion region and the photoelectric conversion region indicates a maximum value is shallower than a depth at which an impurity concentration in the photoelectric conversion region indicates a maximum value.

[B04] The imaging device according to any one of [B01] to [B03], in which a width of a boundary region located between the photoelectric conversion region and the photoelectric conversion region is narrower than a width of the photoelectric conversion region.

[C01]<<Method for Driving Imaging Element>>

A method for driving an imaging element including:

M×N photoelectric conversion regions arrayed such that M photoelectric conversion regions are arrayed in a first direction and N photoelectric conversion regions are arrayed in a second direction different from the first direction;

a floating diffusion layer shared by the M×N photoelectric conversion regions;

a transfer control electrode that is disposed corresponding to each of the photoelectric conversion regions and transfers charges generated in each of the photoelectric conversion regions to the floating diffusion layer;

(M−1)×N first charge transfer control electrodes that control charge transfer between the M photoelectric conversion regions arrayed in the first direction; and (N−1)×M second charge transfer control electrodes that control charge transfer between the N photoelectric conversion regions arrayed in the second direction, the method including:

accumulating charges in the M×N photoelectric conversion regions on the basis of photoelectric conversion; and then in the M photoelectric conversion regions arrayed in the first direction, operating an m-th first charge transfer control electrode [in which m is any integer of 1 to (M−1)] to transfer charges between an m-th photoelectric conversion region and an (m+1)-th photoelectric conversion region, in the N photoelectric conversion regions arrayed in the second direction, not operating an n-th second charge transfer control electrode [in which n is any integer of 1 to (N−1)] to suppress charge transfer between an n-th photoelectric conversion region and an (n+1)-th photoelectric conversion region, and subsequently, sequentially determining an image signal from the N sets of M photoelectric conversion regions arrayed in the first direction via the transfer control electrode and the floating diffusion layer, or accumulating charges in the M×N photoelectric conversion regions on the basis of photoelectric conversion; and then in the M photoelectric conversion regions arrayed in the first direction, not operating an m-th first charge transfer control electrode [in which m is any integer of 1 to (M−1)] to suppress charges between an m-th photoelectric conversion region and an (m+1)-th photoelectric conversion region, in the N photoelectric conversion regions arrayed in the second direction, operating an n-th second charge transfer control electrode [in which n is any integer of 1 to (N−1)] to transfer charges between an n-th photoelectric conversion region and an (n+1)-th photoelectric conversion region, and subsequently, sequentially determining an image signal from the M sets of N photoelectric conversion regions arrayed in the second direction via the transfer control electrode and the floating diffusion layer.

REFERENCE SIGNS LIST 10, 10' Imaging element
20 Base
20A Surface (front surface) of silicon layer (base)
20B Back surface of silicon layer (base)
21 Element isolation structure
22, $22_{12}$, $22_{13}$, $22_{24}$, $22_{34}$ Boundary region
23 Insulating film
24 Interlayer insulating layer
25 Wiring layer
26 Insulating layer
27 Support substrate
30 Control circuit
PD, $PD_1$, $PD_2$, $PD_3$, $PD_4$ Photoelectric conversion region
FD Floating diffusion layer
TG, $TG_1$, $TG_2$, $TG_3$, $TG_4$ Transfer control electrode
CG Charge transfer control electrode
$CG_{12}$ First charge transfer control electrode (first-A charge transfer control electrode)
$CG_{34}$ First charge transfer control electrode (first-B charge transfer control electrode)

CG₁₃ Second charge transfer control electrode (second-A charge transfer control electrode)
CG₂₄ Second charge transfer control electrode (second-B charge transfer control electrode)
CF Color filter layer
OCL On-chip microlens

The invention claimed is:

1. An imaging device comprising a plurality of imaging elements, wherein
each of the imaging elements includes:
M×N photoelectric conversion regions arrayed such that M photoelectric conversion regions are arrayed in a first direction and N photoelectric conversion regions are arrayed in a second direction different from the first direction;
a floating diffusion layer shared by the M×N photoelectric conversion regions;
a transfer control electrode that is disposed corresponding to each of the M×N photoelectric conversion regions and transfers charges generated in each of the M×N photoelectric conversion regions to the floating diffusion layer;
(M−1)×N first charge transfer control electrodes that control charge transfer between the M photoelectric conversion regions arrayed in the first direction; and
(N−1)×M second charge transfer control electrodes that control charge transfer between the N photoelectric conversion regions arrayed in the second direction,
in the M photoelectric conversion regions arrayed in the first direction, an m-th first charge transfer control electrode [in which m is any integer of 1 to (M−1)] controls charge transfer between an m-th photoelectric conversion region and an (m+1)-th photoelectric conversion region, and
in the N photoelectric conversion regions arrayed in the second direction, an n-th second charge transfer control electrode [in which n is any integer of 1 to (N−1)] controls charge transfer between an n-th photoelectric conversion region and an (n+1)-th photoelectric conversion region.

2. The imaging device according to claim 1, wherein
M=2 and N=2, and
each of the imaging elements includes:
a first photoelectric conversion region and a second photoelectric conversion region juxtaposed in the first direction, a third photoelectric conversion region disposed adjacent to the first photoelectric conversion region in the second direction, and a fourth photoelectric conversion region disposed adjacent to the second photoelectric conversion region and the third photoelectric conversion region;
a floating diffusion layer shared by the first photoelectric conversion region, the second photoelectric conversion region, the third photoelectric conversion region, and the fourth photoelectric conversion region;
a first transfer control electrode that transfers charges generated in the first photoelectric conversion region to the floating diffusion layer;
a second transfer control electrode that transfers charges generated in the second photoelectric conversion region to the floating diffusion layer;
a third transfer control electrode that transfers charges generated in the third photoelectric conversion region to the floating diffusion layer;
a fourth transfer control electrode that transfers charges generated in the fourth photoelectric conversion region to the floating diffusion layer;
a first-A charge transfer control electrode that controls charge transfer between the first photoelectric conversion region and the second photoelectric conversion region;
a first-B charge transfer control electrode that controls charge transfer between the third photoelectric conversion region and the fourth photoelectric conversion region;
a second-A charge transfer control electrode that controls charge transfer between the first photoelectric conversion region and the third photoelectric conversion region; and
a second-B charge transfer control electrode that controls charge transfer between the second photoelectric conversion region and the fourth photoelectric conversion region.

3. The imaging device according to claim 2, further comprising a control circuit, wherein
at a time of imaging, the control circuit controls operations of the first charge transfer control electrode and the second charge transfer control electrode in a first mode in which the first charge transfer control electrode is turned into an inoperative state when the second charge transfer control electrode is in an operative state, and in a second mode in which the second charge transfer control electrode is turned into an inoperative state when the first charge transfer control electrode is in an operative state.

4. The imaging device according to claim 3, wherein at the time of imaging, the control circuit further controls the operations of the first charge transfer control electrode and the second charge transfer control electrode in a third mode in which the first charge transfer control electrode and the second charge transfer control electrode are turned into an inoperative state.

5. The imaging device according to claim 3, wherein the control circuit switches between the first mode and the second mode on a basis of posture information of the imaging device.

6. The imaging device according to claim 5, wherein the posture information of the imaging device is information indicating that the imaging device is located in a lateral direction and information indicating that the imaging device is located in a longitudinal direction.

7. The imaging device according to claim 1, wherein a maximum value of an impurity concentration in a boundary region located between the photoelectric conversion region and the photoelectric conversion region is lower than a maximum value of an impurity concentration in the photoelectric conversion region.

8. The imaging device according to claim 1, wherein a depth at which an impurity concentration in a boundary region located between the photoelectric conversion region and the photoelectric conversion region indicates a maximum value is shallower than a depth at which an impurity concentration in the photoelectric conversion region indicates a maximum value.

9. The imaging device according to claim 1, wherein a width of a boundary region located between the photoelectric conversion region and the photoelectric conversion region is narrower than a width of the photoelectric conversion region.

10. The imaging device according to claim 1, wherein an operating voltage of the (M−1)×N first charge transfer control electrodes is the same as an operating voltage of the (N−1)×M second charge transfer control electrodes.

11. The imaging device according to claim 1, wherein an operating voltage of the (M−1)×N first charge transfer control electrodes is different from an operating voltage of the (N−1)×M second charge transfer control electrodes.

12. An imaging element comprising:
- M×N photoelectric conversion regions arrayed such that M photoelectric conversion regions are arrayed in a first direction and N photoelectric conversion regions are arrayed in a second direction different from the first direction;
- a floating diffusion layer shared by the M×N photoelectric conversion regions;
- a transfer control electrode that is disposed corresponding to each of the M×N photoelectric conversion regions and transfers charges generated in each of the M×N photoelectric conversion regions to the floating diffusion layer;
- (M−1)×N first charge transfer control electrodes that control charge transfer between the M photoelectric conversion regions arrayed in the first direction; and
- (N−1)×M second charge transfer control electrodes that control charge transfer between the N photoelectric conversion regions arrayed in the second direction, wherein in the M photoelectric conversion regions arrayed in the first direction, an m-th first charge transfer control electrode [in which m is any integer of 1 to (M−1)] controls charge transfer between an m-th photoelectric conversion region and an (m+1)-th photoelectric conversion region, and in the N photoelectric conversion regions arrayed in the second direction, an n-th second charge transfer control electrode [in which n is any integer of 1 to (N−1)] controls charge transfer between an n-th photoelectric conversion region and an (n+1)-th photoelectric conversion region.

* * * * *